United States Patent
Harada et al.

(10) Patent No.: US 11,001,755 B2
(45) Date of Patent: May 11, 2021

(54) SINTERED PHOSPHOR-COMPOSITE, LIGHT-EMITTING DEVICE, LIGHTING DEVICE AND VEHICLE INDICATOR LAMP

(71) Applicant: Mitsubishi Chemical Corporation, Chiyoda-ku (JP)

(72) Inventors: Takashi Harada, Chiyoda-ku (JP); Yukihiro Miyamoto, Chiyoda-ku (JP); Kentarou Horibe, Chiyoda-ku (JP)

(73) Assignee: Mitsubishi Chemical Corporation, Chiyoda-ku (JP)

( * ) Notice: Subject to any disclaimer, the term of this patent is extended or adjusted under 35 U.S.C. 154(b) by 155 days.

(21) Appl. No.: 16/257,502

(22) Filed: Jan. 25, 2019

(65) Prior Publication Data

US 2019/0153315 A1   May 23, 2019

Related U.S. Application Data

(63) Continuation of application No. PCT/JP2017/027070, filed on Jul. 26, 2017.

(30) Foreign Application Priority Data

Jul. 27, 2016 (JP) .............................. JP2016-147608
Jul. 27, 2016 (JP) .............................. JP2016-147635

(51) Int. Cl.
| | | |
|---|---|---|
| C09K 11/77 | (2006.01) | |
| H01L 33/50 | (2010.01) | |
| C09K 11/08 | (2006.01) | |
| F21K 9/64 | (2016.01) | |
| F21S 43/10 | (2018.01) | |
| C09K 11/02 | (2006.01) | |
| F21Y 115/30 | (2016.01) | |
| F21Y 115/10 | (2016.01) | |

(52) U.S. Cl.
CPC .......... *C09K 11/7766* (2013.01); *C09K 11/02* (2013.01); *C09K 11/08* (2013.01); *C09K 11/0883* (2013.01); *C09K 11/7728* (2013.01); *C09K 11/77747* (2021.01); *F21K 9/64* (2016.08); *F21S 43/10* (2018.01); *H01L 33/50* (2013.01); *H01L 33/501* (2013.01); *H01L 33/504* (2013.01); *H01L 33/507* (2013.01); *F21Y 2115/10* (2016.08); *F21Y 2115/30* (2016.08); *H01L 33/502* (2013.01); *H01L 2933/0041* (2013.01)

(58) Field of Classification Search
CPC . C09K 11/7766; C09K 11/08; C09K 11/0882; C09K 11/7728; C09K 11/02; H01L 33/502; F21K 9/64; F21K 43/10; F21K 2115/10
See application file for complete search history.

(56) References Cited

U.S. PATENT DOCUMENTS

| | | | |
|---|---|---|---|
| 4,733,088 A | 3/1988 | Yamada et al. | |
| 7,963,817 B2 * | 6/2011 | Kameshima | C03C 14/004 |
| | | | 445/24 |
| 8,502,442 B2 * | 8/2013 | Nakamura | C04B 35/6268 |
| | | | 313/503 |
| 2006/0065878 A1 | 3/2006 | Sakane et al. | |
| 2007/0267646 A1 | 11/2007 | Wierer, Jr. et al. | |
| 2008/0138919 A1 | 6/2008 | Mueller et al. | |
| 2009/0072700 A1 | 3/2009 | Kameshima et al. | |
| 2009/0109652 A1 | 4/2009 | Sakane et al. | |
| 2010/0085728 A1 | 4/2010 | Seto et al. | |
| 2010/0142181 A1 * | 6/2010 | Schmidt | C04B 35/593 |
| | | | 362/84 |
| 2010/0258766 A1 | 10/2010 | Sakane et al. | |
| 2010/0308712 A1 | 12/2010 | Liu et al. | |
| 2012/0145962 A1 | 6/2012 | Fukuta et al. | |
| 2013/0234586 A1 | 9/2013 | Liu et al. | |
| 2013/0234588 A1 | 9/2013 | Seto et al. | |
| 2014/0239228 A1 | 8/2014 | Ishizawa | |
| 2015/0021485 A1 | 1/2015 | Hayashi et al. | |
| 2015/0315464 A1 | 11/2015 | Liu et al. | |
| 2017/0321866 A1 | 11/2017 | Asami et al. | |

FOREIGN PATENT DOCUMENTS

| | | |
|---|---|---|
| EP | 3 249 026 A1 | 11/2017 |
| JP | 1-242687 | 9/1989 |
| JP | 2008-53545 | 3/2008 |
| JP | 2008-60428 | 3/2008 |

(Continued)

OTHER PUBLICATIONS

International Preliminary Report on Patentability and Written Opinion dated Feb. 7, 2019 in PCT/JP2017/027070 (submitting English translation only), 9 pages.
Extended European Search Report dated Aug. 30, 2019 in European Patent Application No. 17834420.6 citing document AO therein, 10 pages.
International Search Report dated Sep. 5, 2017 in PCT/JP2017/027070 filed Jul. 26, 2017.

*Primary Examiner* — C Melissa Koslow

(74) *Attorney, Agent, or Firm* — Oblon, McClelland, Maier & Neustadt, L.L.P.

(57) ABSTRACT

A sintered phosphor-composite having a high internal quantum efficiency and a high transmittance is provided. The object can be achieved with a sintered phosphor-composite including a nitride phosphor and a fluoride inorganic binder, wherein, in cross-sectional observation, the sintered phosphor-composite includes at least a portion in which voids of not more than 1 μm are present in a number of not more than 700 within a cross-sectional area of 0.046 mm², or a portion having a void area fraction of not more than 3% within a cross-sectional area of 0.046 mm².

20 Claims, 7 Drawing Sheets

(56) References Cited

FOREIGN PATENT DOCUMENTS

| | | |
|---|---|---|
| JP | 2008-189700 | 8/2008 |
| JP | 2009-249445 | 10/2009 |
| JP | 2010-235912 | 10/2010 |
| JP | 2010-265463 | 11/2010 |
| JP | 2012-72330 | 4/2012 |
| WO | WO 2008/132954 A1 | 11/2008 |
| WO | WO 2009/154193 A1 | 12/2009 |
| WO | WO 2013/073592 A1 | 5/2013 |
| WO | WO 2013/136804 A1 | 9/2013 |
| WO | WO 2016/117623 A1 | 7/2016 |

* cited by examiner

SINTERED PHOSPHOR-COMPOSITE, LIGHT-EMITTING DEVICE, LIGHTING DEVICE AND VEHICLE INDICATOR LAMP

CROSS-REFERENCE TO RELATED APPLICATION

This is a continuation of International Application PCT/JP2017/027070, filed on Jul. 26, 2017, and designated the U.S., and claims priority from Japanese Patent Application 2016-147608 which was filed on Jul. 27, 2016 and Japanese Patent Application 2016-147635 which was filed on Jul. 27, 2016, the entire contents of which are incorporated herein by reference.

TECHNICAL FIELD

The present invention relates to a sintered phosphor-composite comprising a phosphor and a crystalline inorganic binder, a light-emitting device using the sintered phosphor-composite, and a lighting device and a vehicle indicator lamp using the light-emitting device.

BACKGROUND ART

Light-emitting diodes (LEDs) are widely known as semiconductor light-emitting devices and semiconductor light sources capable of generating light having a peak wavelength within a particular range of light spectrum. LEDs are usually used as light sources for lighting apparatus, indicators, vehicle headlights, and displays. As a light-emitting device using an LED and a phosphor, a white light-emitting device having the combination of a blue light-emitting LED chip and a YAG (yttrium-aluminum-garnet) phosphor that converts the blue light into yellow is known. The YAG phosphor is used for a wavelength conversion light-emitting layer in which the YAG phosphor is dispersed in an epoxy resin, silicone resin, or the like, and the layer is arranged in the vicinity of an LED chip. Other than wavelength conversion light-emitting layers in which a phosphor is dispersed in the resin, examples of such layers include ceramic layers composed of a phosphor, and wavelength conversion light-emitting layers composed only of an inorganic material in which a phosphor is dispersed in a ceramic (light-emitting ceramic layer) (Patent Literature 1).

On the other hand, regarding nitrides constituted by ternary or higher-order elements, a number of novel substances have been produced in recent years. In particular, phosphor materials having excellent properties have recently been developed as silicon nitride-based multinary nitrides and oxynitrides, and used for wavelength conversion light-emitting layers. These phosphor materials are known to be excited by a blue LED or a near-ultraviolet LED to emit yellow or red light, and have better temperature dependency of the light-emitting efficiency than oxide-based phosphors (Patent Literature 2).

Conventionally, wavelength conversion light-emitting layers comprising a dispersion in an organic binder such as an epoxy resin or a silicone resin had insufficient durabilities, heat resistances, and luminescence intensities. Thus, for the purpose of obtaining wavelength conversion light-emitting layers having a better durability and heat resistance, methods for preparing a wavelength conversion light-emitting layer (light-emitting ceramic layer) composed only of an inorganic material have been studied as exemplified in Patent Literature 1.

Patent Literature 3 describes, as an example, a phosphor ceramic in which YAG:Ce phosphor particles are dispersed in an inorganic binder comprising any one of calcium fluoride, strontium fluoride, and lanthanum fluoride, or comprising calcium fluoride and strontium fluoride.

In Patent Literature 4, a wavelength conversion light-emitting layer composed only of an inorganic material is prepared by subjecting the combination of a $Y_3(Al,Ga)_5O_{12}$:Ce oxide phosphor, a $Lu_3Al_5O_{12}$:Ce oxide phosphor, and a $CaSiAlN_3$:Eu nitride phosphor to spark plasma sintering to melt a glass powder having a glass transition temperature of not less than 200° C.

PRIOR ART DOCUMENTS

Patent Literature

Patent Literature 1: Japanese Translation of PCT International Application Publication No. 2008-502131
Patent Literature 2: WO 2008/132954
Patent Literature 3: WO 2009/154193
Patent Literature 4: JP 2009-91546 A

SUMMARY OF THE INVENTION

Technical Problem

However, in Patent Literature 1, an aluminum-garnet phosphor is used as a light-emitting ceramic layer. This light-emitting ceramic layer uses a YAG sintered phosphor-composite obtained by preparing a YAG powder from $Y_2O_3$, $Al_2O_3$ (99.999%), and $CeO_2$, forming a compact composed only of the YAG powder, and then performing firing at 1300° C. No inorganic binder is used for the light-emitting ceramic layer, and the sintered body is formed only with the YAG oxide phosphor. Therefore, light scattering is insufficient, and separation between blue light from an LED and yellow from the phosphor occurs, resulting in failure to obtain a uniform light, which is problematic.

Moreover, as exemplified in Patent Literature 3, a ceramic complex of a YAG oxide phosphor phase and a fluoride matrix phase has an internal quantum efficiency of as low as not more than 55%, which is problematic.

In Patent Literature 4, a wavelength conversion light-emitting layer is prepared by dispersing the combination of a YAG oxide phosphor or a LuAg oxide phosphor and a CASN nitride phosphor in glass by melting a glass powder. Since an amorphous glass is used as the inorganic binder, the heat resistance is high, but the thermal conductivity is as low as 2 to 3 W/mK, and the heat radiation performance is low, so that the temperature of the phosphor increases, leading to low brightness (deterioration of the phosphor), which is problematic.

Thus, conventional sintered phosphor-composites lack practically sufficient durability because of their insufficient internal quantum efficiencies, poor temperature properties, and low thermal conductivities.

Solution to Problem (Means 1)
The present inventors found a problem that, in cases where a phosphor and a crystalline inorganic binder are sintered by a conventional method, inclusion of voids in the sintered body occurs in the process of crystal growth in the firing step.

According to a study by the present inventors, it was discovered that a sintered phosphor-composite showing excellent translucency, no birefringence, and high transparency can be produced by setting the number of voids in the sintered phosphor-composite to not more than a particular value. It was also found that, since light scattering decreases due to the decrease in the number of voids, reabsorption of light by the phosphor and the crystalline inorganic binder decreases, so that a sintered phosphor-composite having a high internal quantum efficiency can be produced as a result.

(Means 2)

It has conventionally been thought that, when an oxide phosphor and a fluoride inorganic binder are sintered, solid solution substitution generally occurs to form an oxyfluoride, leading to a decrease in the internal quantum efficiency, since oxygen in the phosphor and fluorine in the inorganic binder have similar ionic radius. In view of this, the present inventors discovered that, by mixing, rather than an oxide phosphor, a nitride phosphor with a fluoride inorganic binder, and sintering the resulting mixture, the original internal quantum efficiency of the nitride phosphor can be maintained. This is thought to be due to the fact that solid solution substitution does not easily occur between nitrogen and fluorine, which have largely different ionic radius.

Moreover, in cases where a fluoride inorganic binder is used, the sintering temperature can be decreased compared to cases where, for example, $Al_2O_3$ is used as the inorganic binder. Thus, reaction between the nitride phosphor and the inorganic binder can be suppressed. The present inventors inferred that a sintered phosphor-composite of a nitride phosphor having a high internal quantum efficiency can thus be obtained.

Further, for example, since a trigonal system $Al_2O_3$ shows birefringence, $Al_2O_3$ becomes a polycrystal in its sintered body, resulting in an insufficient translucency. In contrast, in cases where a fluoride inorganic binder having a cubic crystal system such as $CaF_2$, $BaF_2$, or $SrF_2$ is used, a sintered phosphor-composite showing no birefringence and having high transparency can be produced.

Moreover, by setting the grain size of the fluoride inorganic binder in the sintered phosphor-composites to a particular value, a sintered phosphor-composite having an excellent translucency and a high internal quantum efficiency can be produced.

According to the above means 1, the present inventors used the combination of a phosphor and a crystalline inorganic binder to invent a sintered phosphor-composite for LEDs having a high internal quantum efficiency, high heat resistance, high transmittance, low absorbance, and high thermal conductivity.

Further, by use of the sintered phosphor-composite, the present inventors invented an excellent light-emitting device and lighting device showing high conversion efficiencies and high brightnesses while undergoing less brightness changes/color deviations due to changes in the excitation light intensity or the temperature.

That is, the present invention includes the following.

<1> A sintered phosphor-composite comprising a phosphor and a crystalline inorganic binder,
wherein the sintered phosphor-composite comprises at least a portion in which voids of not more than 1 μm are present in a number of not more than 550 within a cross-sectional area of 0.046 mm² in cross-sectional observation of the sintered phosphor-composite.

<2> A sintered phosphor-composite comprising a phosphor and a crystalline inorganic binder,
wherein the sintered phosphor-composite comprises at least a portion having a void area fraction of not more than 0.3% within a cross-sectional area of 0.046 mm² in cross-sectional observation of the sintered phosphor-composite.

<3> The sintered phosphor-composite according to <1> or <2>,
wherein the phosphor is any one or more of nitrides, oxides, and oxynitrides.

<4> The sintered phosphor-composite according to any one of <1> to <3>,
wherein the phosphor is an oxide phosphor having a crystalline phase with a garnet structure represented by $A_3B_5O_{12}$, where A represents one or more elements selected from a group consisting of Y, Lu, Gd, and La, and B includes Al and/or Ga.

<5> A sintered phosphor-composite comprising a nitride phosphor and a fluoride inorganic binder,
wherein the sintered phosphor-composite comprises at least a portion in which voids of not more than 1 μm are present in a number of not more than 700 within a cross-sectional area of 0.046 mm² in cross-sectional observation of the sintered phosphor-composite.

<6> A sintered phosphor-composite comprising a nitride phosphor and a fluoride inorganic binder,
wherein the sintered phosphor-composite comprises at least a portion having a void area fraction of not more than 3% within a cross-sectional area of 0.046 mm² in cross-sectional observation of the sintered phosphor-composite.

<7> The sintered phosphor-composite according to <5> or <6>,
wherein the nitride phosphor comprises a phosphor having a crystalline phase represented by the following Formula [1]:

$$Ln_xSi_6N_yM_z \qquad [1]$$

where, in Formula [1],

Ln represents one or more elements selected from a group consisting of rare earth elements excluding an element(s) used as an activation element(s);

M represents one or more elements selected from a group consisting of activation elements; and x, y, and z each independently represent a value satisfying the following formulae:

$2.7 \leq x \leq 3.3$;

$10 \leq y \leq 12$; and $0 \leq z \leq 1.0$.

<8> The sintered phosphor-composite according to any one of <1> to <7>,
wherein a concentration of carbon in the sintered phosphor-composite is not more than 1 wt %.

<9> The sintered phosphor-composite according to any one of <1> to <8>,
wherein a concentration of oxygen in the sintered phosphor-composite is not more than 1 wt %.

<10> A light-emitting device comprising the sintered phosphor-composite according to any one of <1> to <9>, and an LED or a semiconductor laser as a light source,
wherein the sintered phosphor-composite absorbs at least part of light from the light source to emit light having a different wavelength.

<11> A lighting device comprising the light-emitting device according to <10>.

<12> A vehicle indicator lamp comprising the light-emitting device according to <10>.

According to the above means 2, the present inventors used a nitride phosphor to invent a sintered phosphor-composite for LEDs having a high internal quantum efficiency, high heat resistance, high transmittance, low absorbance, and high thermal conductivity. Further, by use of the sintered phosphor-composite, the present inventors invented an excellent light-emitting device and lighting device which show high conversion efficiencies and high brightnesses while undergoing less brightness changes/color deviations due to changes in the excitation light intensity or the temperature.

Advantageous Effects of Invention

By the present invention, a sintered phosphor-composite for LEDs having a high internal quantum efficiency and a high transmittance can be provided. Further, by use of the sintered phosphor-composite, a light-emitting device which undergoes less brightness changes/color deviations due to changes in the excitation light intensity or the temperature, and a lighting device and a vehicle indicator lamp using the light-emitting device, can be provided.

DESCRIPTION OF EMBODIMENTS

Figure 1:
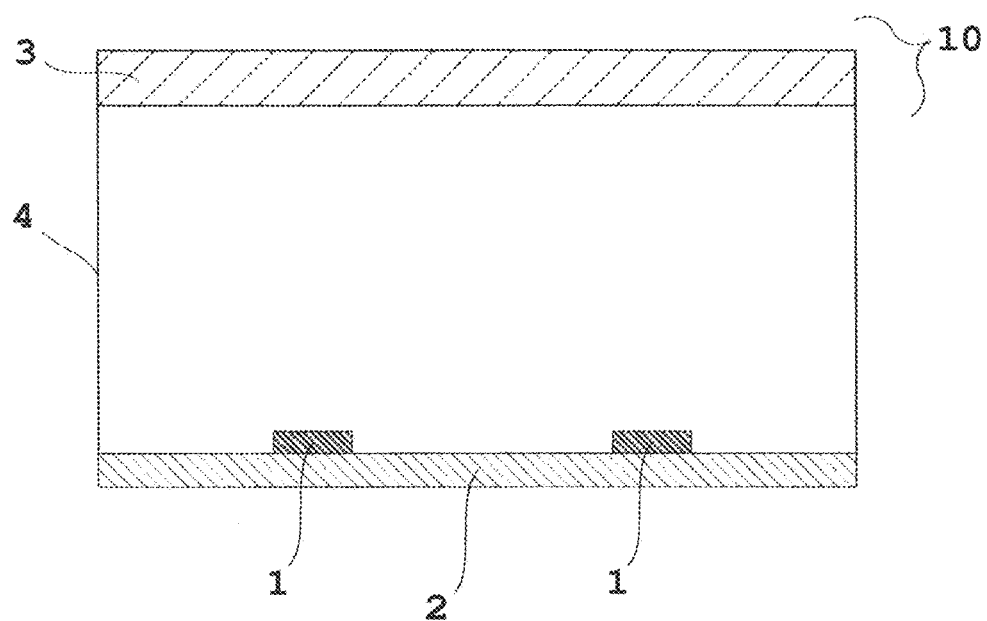
FIG. 1 is a schematic diagram showing an example of configuration of a semiconductor light-emitting device according to an embodiment of the present invention.

Composition formulae of phosphors in the present description are separated from each other by commas. When a plurality of elements are listed with separation by commas, this indicates that one of, or an arbitrary combination and composition of two or more of, the listed elements may be contained. For example, the composition formula "(Ca,Sr,Ba)$Al_2O_4$:Eu" comprehensively represents all of "$CaAl_2O_4$:Eu", "$SrAl_2O_4$:Eu", "$BaAl_2O_4$:Eu", "$Ca_{1-x}Sr_xAl_2O_4$:Eu", "$Sr_{1-x}Ba_xAl_2O_4$:Eu", "$Ca_{1-x}Ba_xAl_2O_4$:Eu", and "$Ca_{1-x-y}Sr_xBa_yAl_2O_4$:Eu" (wherein in the formulae, $0<x<1$, $0<y<1$, and $0<x+y<1$).

The present invention includes the following first to third embodiments.

First embodiment: a sintered phosphor-composite comprising a nitride phosphor and a fluoride inorganic binder, wherein the sintered phosphor-composite comprises at least a portion in which voids of not more than 1 μm are present in a number of not more than 700 within a cross-sectional area of 0.046 mm² in cross-sectional observation of the sintered phosphor-composite.

Second embodiment: a sintered phosphor-composite comprising a phosphor and a crystalline inorganic binder, wherein the sintered phosphor-composite comprises at least a portion in which voids of not more than 1 μm are present in a number of not more than 550 within a cross-sectional area of 0.046 mm² in cross-sectional observation of the sintered phosphor-composite.

Third embodiment: a sintered phosphor-composite comprising a nitride phosphor and a fluoride inorganic binder, wherein the fluoride inorganic binder has an average grain size of not more than 500 μm.

The present invention also includes embodiments related to a light-emitting device using the sintered phosphor-composite, and a lighting device and a vehicle indicator lamp using the light-emitting device.

First Embodiment

The first embodiment of the present invention includes the following inventions.

<1-1> A sintered phosphor-composite comprising a nitride phosphor and a fluoride inorganic binder,
  wherein the sintered phosphor-composite comprises at least a portion in which voids of not more than 1 μm are present in a number of not more than 700 within a cross-sectional area of 0.046 mm² in cross-sectional observation of the sintered phosphor-composite.

<1-2> A sintered phosphor-composite comprising a nitride phosphor and a fluoride inorganic binder,
  wherein the sintered phosphor-composite comprises at least a portion having a void area fraction of not more than 3% within a cross-sectional area of 0.046 mm² in cross-sectional observation of the sintered phosphor-composite.

<1-3> The sintered phosphor-composite according to <1-1> or <1-2>, wherein the nitride phosphor comprises a phosphor having a crystalline phase represented by the following Formula [1]:

$$Ln_xSi_6N_yM_z \qquad [1]$$

(in Formula [1],
  Ln represents one or more elements selected from a group consisting of rare earth elements excluding an element(s) used as an activation element(s);
  M represents one or more elements selected from a group consisting of activation elements; and
  x, y, and z each independently represent a value satisfying the following formulae:

$$2.7 \leq x \leq 3.3;$$

$$10 \leq y \leq 12; \text{ and}$$

$$0 < z \leq 1.0).$$

<1-4> The sintered phosphor-composite according to any one of <1-1> to <1-3>, wherein the nitride phosphor comprises a phosphor having a crystalline phase represented by (Ca, Sr, Ba, Mg) $AlSiN_3$:Eu.

<1-5> The sintered phosphor-composite according to any one of <1-1> to <1-4>, wherein the concentration of carbon in the sintered phosphor-composite is not more than 1 wt %.

<1-6> The sintered phosphor-composite according to any one of <1-1> to <1-4>, wherein the concentration of oxygen in the sintered phosphor-composite is not more than 1 wt %.

<1-7> A light-emitting device comprising the sintered phosphor-composite according to any one of <1-1> to <1-6>, and an LED or a semiconductor laser as a light source, wherein the sintered phosphor-composite absorbs at least part of light from the light source to emit light having a different wavelength.

<1-8> A lighting device comprising the light-emitting device according to <1-7>.

<1-9> A vehicle indicator lamp comprising the light-emitting device according to <1-7>.

{Sintered Phosphor-Composite}

The sintered phosphor-composite according to the first embodiment of the present invention is a sintered phosphor-composite comprising a nitride phosphor and a fluoride inorganic binder, wherein voids are reduced.

[Form of Sintered Phosphor-Composite]

The sintered phosphor-composite in the present embodiment is not limited as long as it is a composite comprising a nitride phosphor and a fluoride inorganic binder as constituents. The sintered phosphor-composite is preferably a composite which is in a state where the nitride phosphor is dispersed in the fluoride inorganic binder, and in which the nitride phosphor is retained mainly by the sintering fluoride inorganic binders to each other, wherein the nitride phosphor and the fluoride inorganic binder are integrated together via physical and/or chemical bonds. By combination of a nitride and a fluoride having different ionic radius, reaction between the nitride phosphor and the fluoride inorganic binder during sintering can be suppressed, and a sintered phosphor-composite having a high internal quantum efficiency can be obtained.

Such a form of the sintered phosphor-composite can be observed by an observation method such as a method in which the surface of the sintered phosphor-composite is observed using a scanning electron microscope, or a method in which the sintered phosphor-composite is cut to prepare a cross-section, or a cross-section polisher is used to prepare a cross-section of the sintered phosphor-composite, followed by observation of the cross-section of the sintered phosphor-composite using a scanning electron microscope.

[Nitride Phosphor]

(Types and the Like of Nitride Phosphor)

Examples of the method for confirming the presence of a nitride phosphor in the sintered phosphor-composite according to the present embodiment include identification of a nitride phosphor phase by X-ray diffraction, observation of the particle structure and elemental analysis by electron microscopy, and elemental analysis by fluorescent X-rays.

The nitride phosphor absorbs at least excitation light emitted from a light-emitting element, and then achieves wavelength conversion to emit light having a wavelength different from that of the light from the light-emitting element. The type of the phosphor is not limited as long as the phosphor composition contains nitrogen. Examples of the nitride phosphor include nitride phosphors containing strontium and silicon in the crystalline phase (more specifically, SCASN and $Sr_2Si_5N_8$), nitride phosphors containing calcium and silicon in the crystalline phase (more specifically, SCASN, CASN, and CASON), nitride phosphors containing strontium, silicon, and aluminum in the crystalline phase (more specifically, SCASN and $Sr_2Si_5N_8$), nitride phosphors containing calcium, silicon, and aluminum in the crystalline phase (more specifically, SCASN, CASN, and CASON), and nitride phosphors containing barium and silicon in the crystalline phase (more specifically, BSON).

According to another aspect of classification, examples of the nitride phosphor include lanthanum nitride silicates (more specifically, LSN), alkaline earth metal nitride silicates (more specifically, $Sr_2Si_5N_8$), and alkaline earth metal nitride silicates (CASN, SCASN, α-SiAlON, and (Ca,Sr)AlSi$_4$N$_7$).

More specific examples of the nitride phosphor include phosphors such as

β-SiAlON which can be represented by the following general formula:

$$Si_{6-z}Al_zO_zN_{8-z}:Eu$$

(in the formula, 0<z<4.2);

α-SiAlON;

LSN represented by the following general formula:

$$Ln_xSi_6N_yM_z \quad [1]$$

(in formula [1], Ln represents one or more elements selected from a group consisting of rare earth elements excluding an element(s) used as an activation element(s); M represents one or more elements selected from a group consisting of activation elements; and x, y, and z each independently represent a value satisfying the following formulae:

$$2.7 \leq x \leq 3.3;$$

$$10 \leq y \leq 12; \text{ and}$$

$$0 < z \leq 1.0);$$

CASN represented by the following general formula:

$$CaAlSiN_3:Eu;$$

SCASN which can be represented by the following general formula:

$$(Ca,Sr,Ba,Mg)AlSiN_3:Eu \text{ and/or } (Ca,Sr,Ba)AlSi(N,O)_3:Eu;$$

CASON which can be represented by the following general formula:

$$(CaAlSiN_3)_{1-x}(Si_2N_2O)_x:Eu$$

(in the formula, 0<x<0.5)

CaAlSi$_4$N$_7$ which can be represented by the following general formula:

$$Eu_y(Sr,Ca,Ba)_{1-y}Al_{1+x}Si_{4-x}O_xN_{7-x}$$

(in the formula, 0≤x<4, 0≤y<0.2);

Sr$_2$Si$_5$N$_8$ which can be represented by the following general formula:

$$(Sr,Ca,Ba)_2Al_xSi_{5-x}O_xN_{8-x}:Eu$$

(in the formula, 0≤x≤2);

BSON which can be represented by the following general formula:

$$M_xBa_y(Sr,Ca,Mg,Zn)_zL_6O_{12}N_2$$

(in the formula, M represents an activation element selected from a group consisting of Cr, Mn, Fe, and lanthanoids (excluding La, Pm, Gd, and Lu); L represents a metallic element including Si belonging to Group 4 or Group 14 of the periodic table; and x, y, and z each independently represent a value satisfying the following formulae:

$$0.03 \leq x \leq 0.9;$$

$$0.9 \leq y \leq 2.95; \text{ and}$$

$$x+y+z=3).$$

Among these phosphors, from the viewpoint of preventing a decrease in the brightness upon production of a sintered phosphor-composite, nitride phosphors containing no oxygen as a constituent element (wherein inevitable contamination with oxygen is acceptable), that is, nitride phosphors such as LSN, CaAlSiN$_3$, SCASN, Sr$_2$Si$_5$N$_8$, β-SiAlON, and BSON are preferably used.

In the composition formula of the LSN phosphor, the Ln preferably includes lanthanum (La) and/or yttrium (Y). In cases where the phosphor is used for daylight color lighting at 6500 K, La is preferably contained at not less than 80 mol %. In cases where the phosphor is used for low color temperature lighting at not more than 5700 K, La and Y are preferably contained in order to shift the fluorescence wavelength toward the long wavelength side, and the ratio of Y to La is preferably not less than 3%, more preferably not less than 5%.

Examples of rare earth elements other than La and Y that may be further included in Ln include gadolinium and the like. In the above uses, since La is preferably contained, the elements further included are preferably elements that easily partially substitute La, that is, among the rare earth elements, those having an ionic radius close to that of La and also having the same charge.

The activation element M preferably includes Eu or Ce, more preferably includes Ce. The molar content of the activation element M is preferably not less than 80 mol %, more preferably not less than 95 mol %. M is most preferably Ce.

The molar ratio of the elements, that is, the ratio among x, 6, and y, is 3:6:11 in terms of the stoichiometric composition. However, since the phosphor can be used even in cases where the ratio has an excess or deficiency of up to about 10%, the values of x and y are set within the ranges of $2.7 \leq x \leq 3.3$ and $10 \leq y \leq 12$, respectively.

The nitride phosphor used in the present embodiment may be one in which a partial site(s) is/are substituted by an alkaline earth metal element(s) such as calcium and strontium, and by aluminum and the like, for the purpose of changing the chromaticity point or the like. Such a nitride phosphor is not excluded from the scope of the present invention. For example, substitution by calcium, yttrium, gadolinium, and/or strontium may be employed for increasing the emission wavelength, and can be a preferred example. Since these elements satisfy the principle of conservation of charge, they may be substituted at the same time as other elements, resulting in partial substitution of an Si and/or N site(s) by oxygen and/or the like. Such a phosphor may also be preferably used.

The mass ratio of oxygen atoms in the nitride phosphor is preferably not more than 25%, more preferably not more than 10%, still more preferably not more than 5.0%, still more preferably not more than 3.0%, especially preferably not more than 1.0%. Since the nitride phosphor inevitably contains oxygen, the lower limit is usually a value higher than 0%. In cases where the mass ratio is within this range, the sintered phosphor-composite obtained has a favorable brightness, which is preferred.

(Particle Size of Nitride Phosphor)

The volume median diameter of the nitride phosphor is usually not less than 0.1 μm, preferably not less than 0.5 μm, and usually not more than 35 μm, preferably not more than 25 μm. In cases where the volume median diameter is within this range, the decrease in the brightness can be suppressed, and aggregation of the phosphor particles can be suppressed, which is preferred. The volume median diameter can be measured by, for example, the Coulter Counter method. Representative examples of the apparatus therefor include a precision particle size distribution measurement apparatus Multisizer (manufactured by Beckman Coulter, Inc.).

(Volume Fraction of Nitride Phosphor)

The volume fraction of the nitride phosphor with respect to the total volume of the sintered phosphor-composite is usually 1% to 50%. In cases where the volume fraction of the nitride phosphor is too low, the thickness of the phosphor layer needs to be increased in order to achieve an arbitrary chromaticity, leading to a low translucency. In cases where the volume fraction is too high, the degree of sintering decreases, leading to a low translucency.

(Production Method for Nitride Phosphor)

Each nitride phosphor used in the present embodiment is a known phosphor, and can be produced by a known method. Therefore, description of its production method is omitted in the present description.

[Fluoride Inorganic Binder]

(Fluoride Inorganic Binder, and Fluoride Inorganic Binder Particles)

Examples of the method for confirming the presence of a fluoride inorganic binder in the sintered phosphor-composite according to the present embodiment include identification of an inorganic binder phase by X-ray diffraction, observation of the surface or the cross-sectional structure and elemental analysis of the sintered body by electron microscopy, and elemental analysis by fluorescent X-rays.

The total volume fraction of the nitride phosphor and the fluoride inorganic binder to the total volume of the sintered phosphor-composite is preferably not less than 80%, more preferably not less than 90%, especially preferably not less than 95%. This is because, in cases where the total volume fraction is low, the effect of the present invention cannot be produced.

The volume fraction of the fluoride inorganic binder to the total volume of the nitride phosphor and the fluoride inorganic binder is usually not less than 50%, preferably not less than 60%, more preferably not less than 70%, and usually not more than 99%, preferably not more than 98%, more preferably not more than 97%.

In the present embodiment, the fluoride inorganic binder is used as a matrix for dispersing the nitride phosphor therein. The fluoride inorganic binder is preferably a crystalline matrix. The fluoride inorganic binder is preferably one which allows transmission of part of the excitation light emitted from the light-emitting element or at least part of the light emitted from the nitride phosphor. From the viewpoint of efficient extraction of the light emitted from the nitride phosphor, the refractive index of the fluoride inorganic binder is preferably close to the refractive index of the phosphor. Further, the fluoride inorganic binder is preferably resistant to the heat generated by irradiation of a strong excitation light, and preferably has heat-radiating properties. By the use of the fluoride inorganic binder, the moldability of the sintered phosphor-composite can be improved.

More specifically, one or more selected from a group consisting of fluorides of an alkaline earth metal or a rare earth metal such as CaF$_2$ (calcium fluoride), MgF$_2$ (magnesium fluoride), BaF$_2$ (barium fluoride), SrF$_2$ (strontium fluoride), LaF$_3$ (lanthanum fluoride), YF$_3$ (yttrium fluoride), and AlF$_3$ (aluminum fluoride); fluorides of a typical metal element; and composites of these; is/are used as the major component of the fluoride inorganic binder. The major component herein means that the fluoride inorganic binder used accounts for not less than 50% by weight.

In particular, CaF$_2$ is preferably used as the fluoride inorganic binder from the viewpoint of the cost and ease of sintering. Alternatively, as the fluoride inorganic binder, a composite comprising CaF$_2$ at not less than 50% by weight is preferably used; a composite comprising CaF$_2$ at not less than 80% by weight is more preferably used; and a composite comprising CaF$_2$ at not less than 90% by weight is especially preferably used. The fluoride inorganic binder may also contain a halide, oxide, and/or nitride other than these at not more than 5%.

The fluoride inorganic binder is constituted by physical and/or chemical bonding of particles having the same composition as the fluoride inorganic binder.

(Physical Properties of Fluoride Inorganic Binder Particles)

Particle Size

The volume median diameter of the fluoride inorganic binder particles is usually not less than 0.01 μm, preferably not less than 0.02 μm, more preferably not less than 0.03 μm, especially preferably not less than 0.05 μm, and usually not more than 15 μm, preferably not more than 10 μm, more preferably not more than 5 μm. In cases where the fluoride inorganic binder particles have a volume median diameter within the range described above, the sintering temperature can be decreased, and deactivation of the nitride phosphor due to reaction between the nitride phosphor and the inorganic binder can be suppressed, so that a decrease in the internal quantum efficiency of the sintered phosphor-composite can be suppressed. The volume median diameter can be measured by, for example, the Coulter Counter method described above. Other representative examples of the apparatus to be used for the measurement include a laser diffraction particle size distribution analyzer, scanning electron microscope (SEM), transmission electron microscope (TEM), and precision particle size distribution measurement apparatus Multisizer (manufactured by Beckman Coulter, Inc.).

Purity

Examples of the method for investigating the purity of the fluoride inorganic binder particles include inductively coupled plasma-atomic emission spectrometry analysis (ICP-AES analysis), and quantitative elemental analysis using fluorescent X-rays.

The purity of the fluoride inorganic binder particles is usually not less than 99%, preferably not less than 99.5%, more preferably not less than 99.9%. In cases where the purity is within this range, generation of foreign substances after the sintering is less likely to occur, and properties of the sintered body such as the transmittance and the light-emitting efficiency are favorable, which is preferred.

Refractive Index

Examples of the method for investigating the refractive index of the fluoride inorganic binder particles include a method in which a sintered body comprising the fluoride inorganic binder particles is mirror-polished, and then subjected to measurement by the minimum deviation method, critical angle method, or V-block method.

The ratio of the refractive index of the fluoride inorganic binder particles (nb) to the refractive index of the nitride phosphor (np), nb/np, is not more than 1, preferably not more than 0.8, more preferably not more than 0.6. The ratio is usually a value larger than 0. In cases where the refractive index ratio is higher than 1, the light extraction efficiency after the sintering tends to be low. Thus, the refractive index is preferably within the range described above.

Thermal Conductivity

Examples of the method for investigating the thermal conductivity of the fluoride inorganic binder particles include a method in which a sintered body comprising the fluoride inorganic binder particles is prepared, and then subjected to measurement by the steady heating method, laser flash method, or periodic heating method.

The thermal conductivity of the fluoride inorganic binder particles is usually not less than 3.0 W/(m·K), preferably not less than 5.0 W/(m·K), more preferably not less than 10 W/(m·K). In cases where the thermal conductivity is less than 3.0 W/(m·K), the temperature of the sintered phosphor-composite increases in some cases due to irradiation of a strong excitation light, which is likely to cause deterioration of the phosphor and its peripheral members. Thus, the thermal conductivity is preferably within the range described above.

Melting Point

The fluoride inorganic binder particles preferably have a low melting point. In cases where fluoride inorganic binder particles having a low melting point are used, the sintering temperature can be decreased, and deactivation of the nitride phosphor due to reaction between the nitride phosphor and the inorganic binder can be suppressed, so that a decrease in the internal quantum efficiency of the sintered phosphor-composite can be suppressed. More specifically, the melting point is preferably not more than 1500° C. The lower limit temperature is not limited, and the melting point is usually not less than 500° C.

Crystal System

The crystal system of the fluoride inorganic binder particles is preferably a cubic system. In cases where the fluoride inorganic binder particles have a cubic system, the resulting sintered phosphor-composite achieves a high transparency, resulting in an improved light extraction efficiency.

Solubility

The fluoride inorganic binder particles preferably have a solubility of not more than 0.05 g per 100 g of water at 20° C.

[Garnet-Based Phosphor that Emits Yellow or Green Light]

A sintered phosphor-composite according to another embodiment of the present embodiment comprises a garnet-based phosphor that emits yellow or green light, a nitride phosphor that emits red light, and a fluoride inorganic binder.

Examples of the nitride phosphor that emits red light include phosphors such as the above-described CASN:

CaAlSiN$_3$:Eu;

SCASN which can be represented by the following general formula:

(Ca,Sr,Ba,Mg)AlSiN$_3$:Eu and/or (Ca,Sr,Ba)AlSi(N,O)$_3$:Eu;

CASON which can be represented by the following general formula:

(CaAlSiN$_3$)$_{1-x}$(Si$_2$N$_2$O)$_x$:Eu (in the formula, 0<x<0.5);

CaAlSi$_4$N$_7$ which can be represented by the following general formula:

Eu$_y$(Sr,Ca,Ba)$_{1-y}$:Al$_{1+x}$Si$_{4-x}$O$_x$N$_{7-x}$ (in the formula, 0≤x<4, 0≤y<0.2); and Sr$_2$Si$_5$N$_8$ which can be represented by the following general formula:

(Sr,Ca,Ba)$_2$Al$_x$Si$_{5-x}$O$_x$N$_{8-x}$:Eu (in the formula, 0≤x≤2);

Examples of the garnet-based phosphor that emits yellow or green light include the following YAG phosphors represented by General Formula [2], GYAG phosphors represented by the General Formula [3], LuAG phosphors represented by the General Formula [4], and phosphors represented by General Formula [5].

$$Y_a(Ce,Tb,Lu)_b(Ga,Sc)_cAl_dO_e \quad [2]$$

(in the formula, a+b=3; 0≤b≤0.2; 4.5≤c+d≤5.5; 0≤c≤0.2; and 10.8≤e≤13.4)

$$Y_a(Ce,Tb,Gd,Lu)_b(Ga,Sc)_cAl_dO_e \quad [3]$$

(in the formula, a+b=3; 0≤b≤0.2; 4.5≤c+d≤5.5; 1.2≤c≤2.6; and 10.8≤e≤13.4)

$$Lu_a(Ce,Tb,Gd,Y)_b(Ga,Sc)_cAl_dO_e \quad [4]$$

(in the formula, a+b=3; 0≤c≤0.2; 4.5≤c+d≤5.5; 0≤d≤0.2; and 10.8≤e≤13.4)

$$Y_aTb_f(Ce,Gd,Lu)_b(Ga,Sc)_cAl_dO_e \quad [5]$$

(in the formula, a+b+f=3; 0≤b≤0.2; 4.5≤c+d≤5.5; 0≤c≤2.6; 10.8≤e≤13.4; and 0.1≤f≤1)

In the present embodiment, the mixing ratio of each of the garnet-based phosphor that emits yellow or green light and the nitride phosphor that emits red light may be appropriately adjusted depending on the required color temperature and color rendering properties of the light. The mixing ratio is usually not less than 0.5%, preferably not less than 1.0%, and usually not more than 50%, preferably not more than 30%, with respect to the total volume of the sintered phosphor-composite.

[Production Method for Sintered Phosphor-Composite]

By using, as major raw materials, the nitride phosphor and the fluoride inorganic binder particles, or the garnet-based phosphor, the nitride phosphor, and the fluoride inorganic binder particles described above, and subjecting their mixture to compaction and sintering, a sintered phosphor-composite can be produced as a composite of these materials. The production method therefor is not limited. A more preferred production method is described below.

Specific examples of the production method include the following (Process 1) and (Process 2):

(Process 1) a process of stirring and mixing a nitride phosphor (or a garnet-based phosphor and a nitride phosphor) and inorganic binder particles, pressing into a compact, and then sintering the compact; and (Process 2) a process of stirring and mixing a nitride phosphor (or a garnet-based phosphor and a nitride phosphor) and inorganic binder particles, and then performing pressing and sintering at the same time.

(Process 1)

Stirring and Mixing Step

First, a nitride phosphor (or a garnet-based phosphor and a nitride phosphor) and inorganic binder particles are mixed together to obtain a mixed powder of the nitride phosphor or the like and the inorganic binder particles. The mixing is carried out such that the volume fraction of the fluoride inorganic binder is usually not less than 50%, preferably not less than 60%, more preferably not less than 70%, and usually not more than 99%, preferably not more than 98%, more preferably not more than 97%, with respect to the whole sintered body comprising the nitride phosphor or the like and the inorganic binder particles, which is taken as 100%. Examples of the method for the stirring and mixing include: dry blending methods such as use of a ball mill, V-blender, or the like; and wet blending methods such as a method in which a solvent is added to the nitride phosphor or the like and the inorganic binder to make them into a slurry, followed by use of a ball mill, homogenizer, ultrasonic homogenizer, twin-screw kneader, or the like. The stirring and mixing time is usually not less than 0.5 hours, preferably not less than 2 hours, more preferably not less than 6 hours, and usually not more than 72 hours, preferably not more than 48 hours, more preferably not more than 24 hours. By such mechanical stirring and mixing, the whole mixture can be uniformly mixed.

In this step, in order to improve moldability in the pressing, an organic binder, a dispersing agent, and/or a solvent may be added. For example, in cases where the organic binder and/or the like is/are added, the organic binder is added usually at 0.1% by weight to 5% by weight; the dispersing agent is added usually at 0.01% by weight to 3% by weight; and/or the solvent is added usually at 10% by weight to 70% by weight; with respect to the whole sintered body, which is taken as 100% by weight, for preparation of a slurry. In such cases, as the organic binder, polyvinyl alcohol, polyacrylic acid, polyvinyl butyral, methyl cellulose, starch, or the like may be used. As the dispersing agent, stearic acid, sodium dodecylbenzenesulfonate, ammonium polycarboxylate, or the like may be used. As the solvent, water, methyl alcohol, ethyl alcohol, isopropyl alcohol, or the like may be used. These may be used either individually or as a mixture.

Examples of the method for mixing these include wet blending methods using a ball mill, homogenizer, ultrasonic homogenizer, twin-screw kneader, or the like. In cases where an organic binder is added, the stirring and mixing time is usually not less than 0.5 hours, preferably not less than 2 hours, more preferably not less than 6 hours, and usually not more than 72 hours, preferably not more than 48 hours, more preferably not more than 24 hours. By such mechanical stirring and mixing, the whole mixture can be uniformly mixed. Inorganic binder particles coated with an organic binder may be mixed with the phosphor.

In cases of wet blending, the stirring and mixing step may be followed by a solvent drying and granulation step. In the solvent drying and granulation step, the solvent is evaporated at a predetermined temperature from the slurry obtained by the stirring and mixing step, to obtain a mixed powder of the nitride phosphor or the like, the inorganic binder particles and organic binders. Alternatively, a known spray drying apparatus (spray dryer apparatus) may be used to prepare granulated particles having a predetermined particle size. The average particle size of the granulated particles is usually not less than 22 μm, preferably not less than 24 μm, more preferably not less than 26 μm, and usually not more than 200 μm, preferably not more than 150 μm, more preferably not more than 100 μm. In cases where the granulated particle size is small, the bulk density is low, leading to poor powder handling properties and difficulty in filling into a press mold. In cases where the granulated particle size is large, air holes remain in the pressed compact, leading to a low degree of sintering.

Molding Step

In this step, single-screw molding or cold isostatic pressing (CIP) is used to perform pressure molding of the mixed powder obtained by the stirring and mixing step, to obtain a green body having an intended shape. The pressure during the molding is usually not less than 1 MPa, preferably not less than 5 MPa, more preferably not less than 10 MPa, and usually not more than 1000 MPa. In cases where the pressure during the molding is too low, a compact cannot be obtained, while in cases where the pressure is too high, the phosphor is mechanically damaged, causing deterioration of light emission properties.

Degreasing Step

When necessary, degreasing is carried out by burning an organic binder component off from the green body, which is molded using the organic binder, in air. The furnace to be used for the degreasing is not limited as long as a desired temperature and pressure can be realized. Although the furnace is not limited as long as the above requirement is satisfied, for example, a shuttle furnace; tunnel furnace; lead hammer furnace; rotary kiln; reaction vessel such as an autoclave; Tammann furnace; Acheson furnace; hot press apparatus; pulse current pressure sintering apparatus; hot isostatic press sintering apparatus; or pressurized atmosphere furnace; may be used. Regarding the heating method, high-frequency induction heating, direct resistance heating, indirect resistance heating, direct combustion heating, radiant heating, electrical heating, or the like may be used. In this process, stirring may be carried out, when necessary.

The atmosphere for the degreasing treatment is not limited. The degreasing treatment is preferably carried out in air or under air flow. The degreasing treatment temperature is usually not less than 300° C., preferably not less than 400° C., more preferably not less than 500° C., and usually not more than 1200° C., preferably not more than 1100° C., more preferably not more than 1000° C., although the appropriate temperature range may depend on the inorganic binder used.

The degreasing treatment time is usually not less than 0.5 hours, preferably not less than 1 hour, more preferably not less than 2 hours, and usually not more than 6 hours, preferably not more than 5 hours, more preferably not more than 4 hours. In cases where the treatment temperature and/or the treatment time is below this range, the organic component cannot be sufficiently removed, while in cases where it is above this range, degradation of the surface of the phosphor such as oxidation occurs, so that deterioration of light emission properties tends to occur.

In the degreasing step, the thermal history temperature conditions, heating rate, cooling rate, heat treatment time, and the like may be appropriately set. It is also possible to increase the temperature to a predetermined value after performing heat treatment within a relatively low temperature range. The reaction device used in this step may be either for a batch method or for a continuous method. Either a single device or a plurality of devices may be used.

Sintering Step

By sintering the compact obtained through the molding step and/or the degreasing step, a sintered phosphor-composite is obtained. The process used for the sintering is not limited as long as a desired temperature and pressure can be realized. For example, a shuttle furnace; tunnel furnace; lead hammer furnace; rotary kiln; reaction vessel such as an autoclave; Tammann furnace; Acheson furnace; hot press apparatus; pulse current pressure sintering apparatus; hot isostatic press sintering apparatus; or pressurized atmosphere furnace; may be used. Regarding the heating method, high-frequency induction heating, direct resistance heating, indirect resistance heating, direct combustion heating, radiant heating, electrical heating, or the like may be used. In this process, stirring may be carried out, when necessary. The atmosphere for the sintering treatment is not limited. The treatment is preferably carried out under air atmosphere, under $N_2$ atmosphere, under Ar atmosphere, under vacuum, under air flow, under $N_2$ flow, under Ar flow, under air pressure, under $N_2$ pressure, or under Ar pressure. In particular, by performing the heating under vacuum, removal of the gas generated from the raw material can be promoted, and therefore a sintered body with decreased voids can be effectively obtained. $H_2$ may be introduced into the atmospheric gas as appropriate.

The sintering treatment temperature is usually not less than 300° C., preferably not less than 400° C., more preferably not less than 500° C., and usually not more than 1900° C., preferably not more than 1500° C., more preferably not more than 1300° C., although the optimum temperature range may vary depending on the inorganic binder used. The sintering temperature is a temperature lower than the melting point of the used fluoride inorganic binder usually by 50° C. or more, preferably by 100° C. or more, and more preferably 150° C. or more. Here, the melting point of calcium fluoride ($CaF_2$) is 1418° C., and the melting point of strontium fluoride ($SrF_2$) is 1477° C. The sintering treatment may be carried out in an atmosphere under pressurization. After the molding step and prior to the sintering, a degassing step may be carried out at a temperature lower than the sintering temperature The heating rate during the firing is usually not more than 10° C./minute, preferably not more than 2.5° C./minute, more preferably not more than 1° C./minute. In cases where the heating time is short, the sintering proceeds before the removal of the gas generated from the raw materials, which may cause a decrease in the degree of sintering. Instead of the control of the heating rate, a temperature lower than the peak firing temperature may be maintained followed by performing firing at an increased temperature, or prefiring may be carried out at a temperature lower than the peak firing temperature as a degassing treatment step.

The sintering treatment time is usually not less than 0.1 hours, preferably not less than 0.5 hours, more preferably not less than 1 hour, and usually not more than 6 hours, preferably not more than 5 hours, more preferably not more than 4 hours. In cases where the treatment temperature and/or the treatment time is below this range, the organic component cannot be sufficiently removed, while in cases where it is above this range, degradation of the surface of the phosphor such as oxidation occurs, causing deterioration of light emission properties.

In the sintering step, the thermal history temperature conditions, heating rate, cooling rate, heat treatment time, and the like may be appropriately set. It is also possible to increase the temperature to a predetermined value after performing heat treatment within a relatively low temperature range. The reaction device used in this step may be either for a batch method or for a continuous method. Either a single device or a plurality of devices may be used.

The compact once obtained in the sintering step may be further subjected to sintering. Examples of the process used for the sintering include, but are not limited to, use of a hot isostatic press sintering apparatus (HIP).

In the sintering step, a sintering aid may be used as appropriate. Examples of the sintering aid used for the sintering step include, but are not limited to, MgO, $Y_2O_3$, CaO, $Li_2O$, BaO, $La_2O$, $Sm_2O_3$, $Sc_2O_3$, $ZrO_2$, $SiO_2$, $Al_2O$, $TiO_2$, $MgAl_2O_4$, LiF, NaF, $LaF_3$, $MgF_2$, BN, AlN, $Si_3N_4$, Mg, Zn, Ni, W, $ZrB_2$, $H_2$, Ti, and Mn. Two or more of these may be used as a mixture.

(Process 2)

Stirring and Mixing Step

This step may be carried out in the same manner as the stirring and mixing step of Process 1.

Pressure Sintering Step

The mixed powder of the nitride phosphor or the like and the inorganic binder particles obtained by the stirring and mixing step is heated under pressure to obtain a sintered phosphor-composite. The furnace to be used for the pressure sintering is not limited as long as a desired temperature and pressure can be realized. For example, a hot press apparatus, a pulse current pressure sintering apparatus, or a hot isostatic press sintering apparatus (HIP) may be used. Regarding the heating method, high-frequency induction heating, direct resistance heating, indirect resistance heating, direct combustion heating, radiant heating, electrical heating, or the like may be used. The atmosphere for the pressure sintering treatment is not limited. The treatment is preferably carried out under air atmosphere, under $N_2$ atmosphere, under Ar atmosphere, under vacuum, under air flow, under $N_2$ flow, under Ar flow, under air pressure, under $N_2$ pressure, or under Ar pressure. $H_2$ may be introduced into the atmospheric gas as appropriate. The sintering treatment temperature is usually not less than 300° C., preferably not less than 400° C., more preferably not less than 500° C., and usually not more than 1900° C., preferably not more than 1500° C., more preferably not more than 1300° C., still more preferably not more than 1100° C., still more preferably not more than 1000° C., although the optimum temperature range may vary depending on the inorganic binder used. The sintering temperature is a temperature lower than the melting point of the used fluoride inorganic binder usually by 50° C. or more, preferably by 100° C. or more, and more preferably 150° C. or more. Here, the melting point of calcium fluoride ($CaF_2$) is 1418° C., and the melting point of strontium fluoride ($SrF_2$) is 1477° C.

The heating rate to the sintering treatment temperature is usually not more than 10° C./minute, preferably not more than 2.5° C./minute, more preferably not more than 1° C./minute. In cases where the heating time is short, the sintering proceeds before the removal of the gas generated from the raw materials, which may cause a decrease in the degree of sintering. Instead of the control of the heating rate, a temperature lower than the peak firing temperature may be maintained followed by performing firing at an increased temperature, or prefiring may be carried out at a temperature lower than the peak firing temperature as a degassing treatment step.

The sintering treatment time is usually not less than 0.1 hours, preferably not less than 0.5 hours, more preferably not less than 1 hour, and usually not more than 6 hours, preferably not more than 5 hours, more preferably not more than 4 hours.

The pressing pressure is usually not less than 1 MPa, preferably not less than 5 MPa, more preferably not less than 10 MPa, and usually not more than 1000 MPa, preferably not more than 800 MPa, more preferably not more than 600 MPa. In cases where the pressure during the molding is too low, a compact cannot be obtained, while in cases where the pressure is too high, the phosphor is mechanically damaged, causing deterioration of light emission properties.

In the press sintering step, the thermal history temperature conditions, heating rate, cooling rate, heat treatment time, and the like may be appropriately set. It is also possible to increase the temperature to a predetermined value after performing heat treatment within a relatively low temperature range. The reaction device used in this step may be either for a batch method or for a continuous method. Either a single device or a plurality of devices may be used.

In the sintering step, a sintering aid may be used as appropriate. Examples of the sintering aid used for the sintering step include, but are not limited to, MgO, $Y_2O_3$, CaO, $Li_2O$, BaO, $La_2O_3$, $Sm_2O_3$, $Sc_2O_3$, $ZrO_2$, $SiO_2$, $Al_2O_3$, $TiO_2$, $MgAl_2O_4$, LiF, NaF, $LaF_3$, $MgF_2$, BN, AlN, $Si_3N_4$, Mg, Zn, Ni, W, $ZrB_2$, $H_2$, Ti, and Mn. Two or more of these may be used as a mixture.

Although the sintered phosphor-composite obtained may be used as it is, it is usually sliced to a predetermined thickness, and then processed into a plate shape having a predetermined thickness by grinding and polishing, to obtain a plate-shaped sintered phosphor-composite. The grinding and polishing conditions are not limited. For example, polishing is performed using a #800 diamond grindstone at a grindstone rotation speed of 80 rpm and a work rotation speed of 80 rpm at 50 g/cm² for processing the sintered phosphor-composite into a plate shape. The final thickness of the sintered phosphor-composite is usually not less than 30 μm, preferably not less than 50 μm, more preferably not less than 100 μm regarding the lower limit, and usually not more than 2000 μm, preferably not more than 1000 μm, more preferably not more than 800 μm, still more preferably not more than 500 μm regarding the upper limit. In cases where the thickness of the sintered phosphor-composite plate is below this range, breakage easily occurs, while in cases where the thickness exceeds this range, transmission of light is inhibited.

Further, after polishing the surface as appropriate, the surface may be subjected to irregularity processing by a wet etching process, dry-wet etching process, or the like.

{Physical Properties of Sintered Phosphor-Composite}

The sintered phosphor-composite according to one embodiment of the present embodiment (including a plate-shaped sintered phosphor-composite; the same applies hereinafter) is a sintered phosphor-composite comprising a nitride phosphor and a fluoride inorganic binder, wherein the sintered phosphor-composite comprises at least a portion in which voids of not more than 1 μm are present usually in a number (which may be hereinafter simply referred to as "void number") of not more than 700 within an area of 0.046 mm² in cross-sectional observation of the sintered phosphor-composite. The sintered phosphor-composite comprises at least a portion having the void number of preferably not more than 600, more preferably not more than 300, still more preferably not more than 100, especially preferably not more than 10. Although the portion showing such a small number of voids only needs to be at least part of the sintered phosphor-composite, it is preferred for the sintered phosphor-composite to show such a small number of voids in not less than half thereof, and it is more preferred for the sintered phosphor-composite to show such a small number of voids in its entirety. In general, the size of each void is not more than 5 μm, and most of the voids have a size of not more than 1 μm. Since voids of not less than 1 μm are often formed by joining of a plurality of sub-micron voids together during the sintering, the number of voids with a size of more than 1 μm is smaller than the number of sub-micron voids.

That is, since voids of not more than 1 μm are formed more frequently, they have a larger impact on properties of the sintered phosphor-composite. Therefore, the calculation was carried out focusing especially on voids of not more than 1 μm.

As the number of voids decreases, the translucency can be increased more advantageously. Therefore, there is no lower limit of the number of voids. Usually, however, the number is larger than 0.

A sintered phosphor-composite according to another embodiment of the present embodiment is a sintered phosphor-composite comprising a nitride phosphor and a fluoride inorganic binder, wherein the sintered phosphor-composite comprises at least a portion having a void area fraction of usually not more than 3% within an area of 0.046 mm² in cross-sectional observation of the sintered phosphor-composite. The sintered phosphor-composite comprises at least a portion having the void area fraction of preferably not more than 2%, more preferably not more than 1%, still more preferably not more than 0.5%, especially preferably not more than 0.1%. Although the portion showing such a small void area fraction only needs to be at least part of the sintered phosphor-composite, it is preferred for the sintered phosphor-composite to show such a small void area fraction in not less than half thereof, and it is more preferred for the sintered phosphor-composite to show such a small void area fraction in its entirety.

As the void area fraction decreases, the translucency can be increased more advantageously. Therefore, there is no lower limit of the void area fraction. Usually, however, the void area fraction is not less than 0.

The present inventors inferred that, in cases where the number of voids and/or the void area fraction in the sintered phosphor-composite is/are within these ranges, that is, in cases where the abundance of voids themselves in the sintered phosphor-composite is reduced, the translucency of the sintered phosphor-composite can be improved, and the light-emitting efficiency of the LED light-emitting device can be improved.

[Methods for Measuring Number of Voids and Void Area Fraction]

By subjecting the sintered phosphor-composite to a cross-section cutting process, and observing the cross-section with a scanning electron microscope (SEM), the number of voids and the void area fraction can be measured. After the cutting process and prior to the observation of the cross-section with an SEM, the cross-sectional surface may be or may not be polished. More specifically, the cross-section was observed at a magnification of 100, and then a typical area was selected, followed by measurement at a magnification of 500. In the SEM image, the void portions to be measured appear black. The diameters, the number, and the area of the black portions recognized as voids were determined for an area of 0.046 mm² in the measured image, which nearly corresponded to the viewing area when the measurement was carried out at a magnification of 500. The diameter of each void was determined by calculating the average value of the diameter in the vertical direction and the horizontal direction observed.

Figure 3:
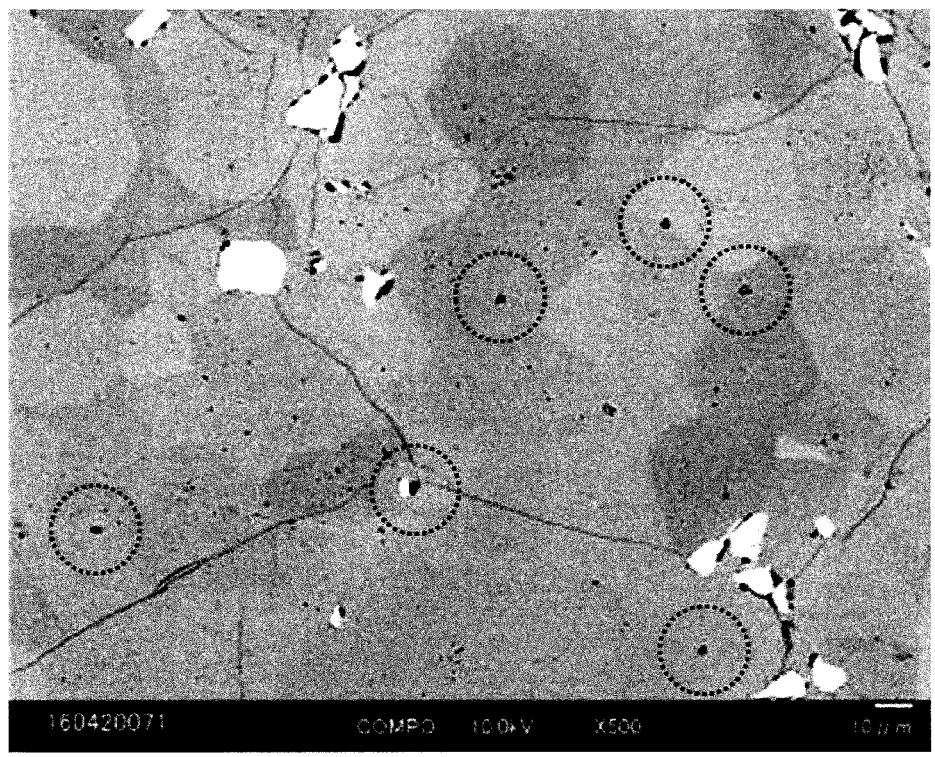
FIG. 3 is an SEM image of a cross-section of a sintered phosphor-composite prepared in an Example (drawing-substituting photograph).
Figure 4:
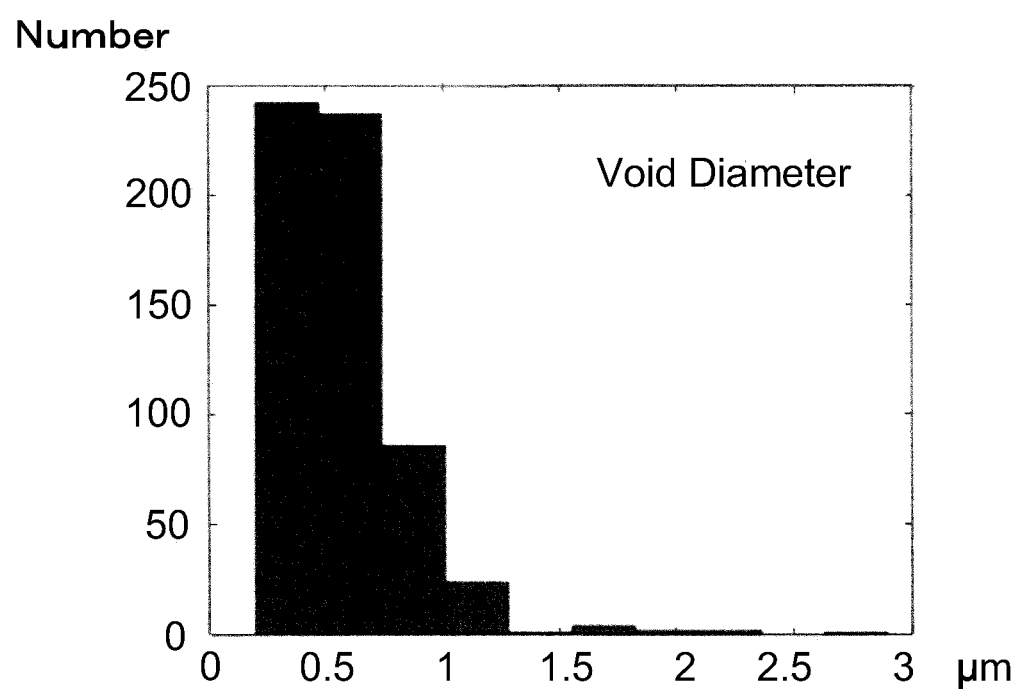
FIG. 4 is a graph showing the result of counting of the number of voids in a cross-section of a sintered phosphor-composite prepared in an Example.

In FIG. 3, each black portion corresponds to a void in the SEM image. Representative voids are indicated with broken lines.

[Cause of Production of Effect]

The present inventors assume that the reason why a sintered phosphor-composite having excellent properties can be obtained in the present embodiment by setting the number of voids and the void area fraction in the sintered phosphor-composite within the above-described ranges, that is, by reducing the abundance of voids themselves in the sintered phosphor-composite, is as follows.

A void is an air hole present in the sintered phosphor-composite, and means a space containing a gaseous matter such as air or a gas.

Voids present in a sintered phosphor-composite cause light scattering, leading to a decreased translucency. Since a sintered phosphor-composite having a low translucency does not easily allow transmission of light of an LED that emits excitation light, or light of a phosphor, an LED light-emitting device having such a sintered phosphor-composite is an LED light-emitting device having a low light-emitting efficiency. In the present embodiment, by reducing the voids generated in the sintered phosphor-composite during the sintering, the translucency of the sintered phosphor-composite can be improved, and as a result, the light-emitting efficiency of an LED light-emitting device can be improved.

[Control of Number of Voids and Void Area Fraction]

The number of voids and the void area fraction in the sintered phosphor-composite can be set within the above-described ranges by, for example, reducing the content of impurities in the phosphor and the fluoride inorganic binder used as raw materials, decreasing the heating rate before reaching the sintering temperature in the sintering step, reducing the carbon concentration and the oxygen concentration in the sintered phosphor-composite itself, and/or subjecting the compact once obtained by the sintering step or the press sintering step to further sintering. The carbon concentration in the sintered phosphor-composite itself is preferably not more than 10 wt %, and the oxygen concentration is preferably not more than 10 wt %. The reduction of the carbon concentration and the oxygen concentration in the sintered phosphor-composite itself can be achieved by controlling the sintering temperature and/or the sintering time, and/or reducing the content of impurities in the phosphor and the fluoride inorganic binder used as raw materials.

[Properties of Sintered Phosphor-Composite]

The sintered phosphor-composite according to the present embodiment preferably further has the following properties.

Degree of Sintering

In the method for investigating the degree of sintering of the sintered phosphor-composite according to the present embodiment, the density $\rho_a$ is measured by the Archimedes method, and the theoretical density $\rho_{theoretical}$ of the sintered body is used to perform the following calculation: $\rho_a/\rho_{theoretical} \times 100$.

The theoretical density herein is the density under the assumption that the atoms in the material are ideally arranged.

The degree of sintering of the sintered phosphor-composite is usually not less than 90%, preferably not less than 95%, more preferably not less than 99%. In cases where the degree of sintering is within this range, air holes (gaps) present in the sintered phosphor-composite can be reduced, and therefore the light transmittance and the light extraction efficiency (conversion efficiency) can be improved. In contrast, in cases where the degree of sintering is below this range, strong light scattering causes a decrease in the light extraction efficiency. Thus, the degree of sintering is preferably within the range described above.

The degree of sintering of the sintered phosphor-composite can be set within this range by controlling the sintering temperature and the sintering time.

Thermal Conductivity

Examples of the method for investigating the thermal conductivity of the sintered phosphor-composite according to the present embodiment include measurement by the steady heating method, laser flash method, or periodic heating method.

The thermal conductivity of the sintered phosphor-composite is usually not less than 3.0 W/(m·K), preferably not less than 5.0 W/(m·K), more preferably not less than 10.0 W/(m·K). In cases where the thermal conductivity is less than 3.0 W/(m·K), the temperature of the sintered body increases due to irradiation of a strong excitation light, which is likely to cause deterioration of the phosphor and its peripheral members. Thus, the thermal conductivity is preferably within the range described above.

Absorbance

Examples of the method for investigating the absorbance of the sintered phosphor-composite according to the present embodiment include measurement with an absorptiometer (UV-Vis).

The absorbance of the sintered phosphor-composite is usually not more than 10%, preferably not more than 5.0%, more preferably not more than 3.5%, still more preferably not more than 1.5%. In cases where the absorbance is more than 10%, the light-emitting efficiency (internal quantum efficiency) and the transmittance decrease, which is likely to result in a low light extraction efficiency (conversion efficiency). Thus, the absorbance is preferably within the range described above.

Transmittance

Examples of the method for investigating the transmittance of the sintered phosphor-composite according to the present embodiment include measurement with an integrating sphere and a spectroscope. The transmittance depends on the amount of the phosphor and the thickness of the sintered phosphor-composite, and is defined as, for example, the transmittance at a phosphor concentration and a sintered phosphor-composite thickness designed to achieve a chromaticity range used for illumination.

The transmittance of the sintered phosphor-composite, when measured at a wavelength of 700 nm, is usually not less than 20%, preferably not less than 25%, more preferably not less than 30%, still more preferably not less than 40%. In cases where the transmittance is less than 20%, the amount of transmission of excitation light through the sintered phosphor-composite decreases, so that a desired chromaticity cannot be easily realized, and the light extraction efficiency (conversion efficiency) tends to decrease.

Mechanical Strength

The sintered phosphor-composite according to the present embodiment preferably has a mechanical strength sufficient for achieving resistance to processing (slicing, grinding, and polishing). In cases where the sintered phosphor-composite does not have a sufficient mechanical strength during processing into a plate shape or incorporation into a light-emitting device, the production yield decreases, and the incorporation method is limited, which is not preferred.

Contained Elements

The content of carbon in the sintered phosphor-composite according to the present embodiment is preferably not more than 10 wt %, preferably not more than 5 wt %, more preferably not more than 3 wt %, still more preferably not more than 1 wt %.

The content of oxygen in the sintered phosphor-composite according to the present embodiment is preferably not more than 10 wt %, preferably not more than 5 wt %, more preferably not more than 3 wt %, still more preferably not more than 1 wt %.

Since carbon and oxygen contained in the sintered phosphor-composite may affect light emission properties, their contents are preferably small. Therefore, there is no lower limit of their contents. However, since inevitable contamination occurs through the raw materials and during the processing, the lower limit is usually larger than 0.

A sintered phosphor-composite satisfying the above conditions has excellent properties since the contents of carbon and oxygen which particularly affect light emission properties are lower than a value which particularly affect light emission properties, and also has excellent light emission properties since the sintered phosphor-composite itself is in a state where the components are in close contact with each other. That is, the fact that the contents of carbon and oxygen are not more than the above-described particular values is an index indicating a high quality state of the sintered phosphor-composite.

Color Temperature CCT, Chromaticity Coordinates CIE-x,y

The color temperature of the sintered phosphor-composite according to the present embodiment is calculated from the emission color obtained by radiation of blue light with a peak wavelength of 450 nm emitted from an LED, which emission color includes the transmitted blue light.

The color temperature of a sintered phosphor-composite used for common lighting devices and the like, in terms of the color temperature of light emitted upon excitation with blue light with a wavelength of 450 nm, is usually 1900 K to 10,000 K, more commonly 2700 K to 8000 K.

Internal Quantum Efficiency

The internal quantum efficiency (iQE) of the sintered phosphor-composite according to the present embodiment is calculated as $n_{em}/n_{ex}$, wherein $n_{ex}$ represents the number of photons absorbed by the sintered phosphor-composite when blue light with a peak wavelength of 450 nm is radiated, and $n_{em}$ represents the number of photons of converted light obtained by conversion of the photons absorbed. From the viewpoint of providing a high-brightness light-emitting device wherein the internal quantum efficiency of light emitted upon excitation with blue light with a wavelength of 450 nm is usually not less than 40%, the internal quantum efficiency of the sintered phosphor-composite is preferably as high as possible. The internal quantum efficiency is preferably not less than 60%, more preferably not less than 65%, still more preferably not less than 70%, still more preferably not less than 75%, especially preferably not less than 80%. In cases where the internal quantum efficiency is low, the light extraction efficiency (conversion efficiency) tends to be low.

Second Embodiment

The second embodiment of the present invention includes the following inventions.

<2-1> A sintered phosphor-composite comprising a phosphor and a crystalline inorganic binder,
wherein the sintered phosphor-composite comprises at least a portion in which voids of not more than 1 μm are present in a number of not more than 550 within a cross-sectional area of 0.046 mm² in cross-sectional observation of the sintered phosphor-composite.

<2-2> A sintered phosphor-composite comprising a phosphor and a crystalline inorganic binder,
wherein the sintered phosphor-composite comprises at least a portion having a void area fraction of not more than 0.3% within a cross-sectional area of 0.046 mm² in cross-sectional observation of the sintered phosphor-composite.

<2-3> The sintered phosphor-composite according to <2-1> or <2-2>, wherein the phosphor is any one or more of nitrides, oxides, and oxynitrides.

<2-4> The sintered phosphor-composite according to any one of <2-1> to <2-3>, wherein the phosphor is an oxide phosphor having a crystalline phase with a garnet structure represented by $A_3B_5O_{12}$ (wherein A represents one or more elements selected from a group consisting of Y, Lu, Gd, and La, and B includes Al and/or Ga).

<2-5> The sintered phosphor-composite according to any one of <2-1> to <2-4>, wherein the concentration of carbon in the sintered phosphor-composite is not more than 1 wt %.

<2-6> The sintered phosphor-composite according to any one of <2-1> to <2-5>, wherein the concentration of oxygen in the sintered phosphor-composite is not more than 1 wt %.

<2-7> A light-emitting device comprising the sintered phosphor-composite according to any one of <2-1> to <2-6>, and an LED or a semiconductor laser as a light source, wherein the sintered phosphor-composite absorbs at least part of light from the light source to emit light having a different wavelength.

<2-8> A lighting device comprising the light-emitting device according to <2-7>.

<2-9> A vehicle indicator lamp comprising the light-emitting device according to <2-7>.

{Sintered Phosphor-Composite}

The sintered phosphor-composite according to the present embodiment is a sintered phosphor-composite comprising a phosphor and a crystalline inorganic binder, wherein voids are reduced. It should be noted that the first embodiment described above is a preferred mode of the second embodiment except for the number of voids of not more than 1 μm and the void area fraction within a cross-sectional area of 0.046 mm$^2$ in cross-sectional observation of the sintered phosphor-composite.

[Form of Sintered Phosphor-Composite]

The description in the "Form of Sintered Phosphor-Composite" section for the description of the first embodiment is applied herein.

More specifically, the sintered phosphor-composite in the present embodiment is not limited as long as it is a composite comprising a phosphor and a crystalline inorganic binder as constituents. The sintered phosphor-composite is preferably a composite which is in a state where the phosphor is dispersed in the crystalline inorganic binder, and in which the phosphor is retained mainly by the sintered crystalline inorganic binder, wherein the phosphor and the crystalline inorganic binder are integrated together via physical and/or chemical bonds. Preferably, by combination of a phosphor and a crystalline inorganic compound having different ionic radius, reaction between the phosphor and the crystalline inorganic binder during sintering can be suppressed, and a sintered phosphor-composite having a high internal quantum efficiency can be obtained.

[Phosphor]

(Types and the Like of Phosphor)

Examples of the method for confirming the presence of a phosphor in the sintered phosphor-composite according to the present embodiment include identification of a phosphor phase by X-ray diffraction, observation of the particle structure and elemental analysis by electron microscopy, and elemental analysis by fluorescent X-rays.

The phosphor absorbs at least excitation light emitted from a light-emitting element, and then achieves wavelength conversion to emit light having a wavelength different from that of the light from the light-emitting element. The phosphor composition is not limited. Examples of the type of the phosphor include, but are not limited to, oxides, nitrides, and oxynitrides. The phosphor may be any one or more of these. Examples of the oxide phosphors include, but are not limited to, $A_3B_5O_{12}$ (wherein A represents one or more elements selected from a group consisting of Y, Lu, Gd, and La, and B includes Al and/or Ga), which is a phosphor having a crystalline phase with a garnet structure, more specifically, $(Y,Lu,Gd)_3(Al,Ga)_5O_{12}$:Ce, a barium aluminum oxide phosphor BAM ($BaMgAl_{10}O_{17}$:Eu), and a halophosphate phosphor SCA ($Sr_5(PO_4)_3Cl$:Eu).

In addition, the description after "According to another aspect of classification, examples of the nitride phosphor include" in the "Nitride Phosphor" section for the description of the first embodiment is applied herein.

(Particle Size of Phosphor, Volume Fraction of Phosphor, and Method for Producing Phosphor)

The descriptions in the "Particle Size of Nitride Phosphor" section, the "Volume Fraction of Nitride Phosphor" section, and the "Production Method for Nitride Phosphor" section for the description of the first embodiment are applied herein.

[Crystalline Inorganic Binder]

(Crystalline Inorganic Binder and Crystalline Inorganic Binder Particles)

Examples of the method for confirming the presence of a crystalline inorganic binder in the sintered phosphor-composite according to the present embodiment include identification of an inorganic binder phase by X-ray diffraction, observation of the surface or the cross-sectional structure and elemental analysis of the sintered body by electron microscopy, and elemental analysis by fluorescent X-rays.

The total volume fraction of the phosphor and the crystalline inorganic binder to the total volume of the sintered phosphor-composite is preferably not less than 80%, more preferably not less than 90%, especially preferably not less than 95%. This is because, in cases where the total volume fraction is low, the effect of the present invention cannot be produced.

The volume fraction of the crystalline inorganic binder to the total volume of the phosphor and the crystalline inorganic binder is usually not less than 50%, preferably not less than 60%, more preferably not less than 70%, and usually not more than 99%, preferably not more than 98%, more preferably not more than 97%.

In the present embodiment, the crystalline inorganic binder is used as a matrix for dispersing the phosphor therein. The crystalline inorganic binder is preferably one which allows transmission of part of the excitation light emitted from the light-emitting element or at least part of the light emitted from the phosphor. From the viewpoint of efficient extraction of the light emitted from the phosphor, the refractive index of the crystalline inorganic binder is preferably close to the refractive index of the phosphor. Further, the crystalline inorganic binder is preferably resistant to the heat generated by irradiation of a strong excitation light, and preferably has heat-radiating properties. By the use of the crystalline inorganic binder, the moldability of the sintered phosphor-composite can be improved.

The crystalline inorganic binder is not limited as long as it has a composition that forms a crystalline matrix by sintering, and examples of the crystalline inorganic binder include oxide inorganic binders, nitride inorganic binders, and fluoride inorganic binders.

Specific examples of the oxide inorganic binders include, but are not limited to, $Al_2O_3$ (alumina), $ZrO_2$ (zirconia), $TiO_2$ (titania), and $La_2O_3$.

Specific examples of the nitride inorganic binders include, but are not limited to, AlN (aluminum nitride), $Si_3N_4$ (silicon nitride), and BN (boron nitride).

Specific examples of the fluoride inorganic binders include one or more selected from a group consisting of fluorides of an alkaline earth metal or a rare earth metal such as $CaF_2$ (calcium fluoride), $MgF_2$ (magnesium fluoride), $BaF_2$ (barium fluoride), $SrF_2$ (strontium fluoride), $LaF_3$ (lanthanum fluoride), $YF_3$ (yttrium fluoride), and $AlF_3$ (aluminum fluoride); fluorides of a typical metal element; and composites of these.

In particular, a fluoride inorganic binder is preferably used as the major component. The major component herein means that the fluoride inorganic binder used accounts for not less than 50% by weight.

The crystalline inorganic binder is constituted by physical and/or chemical bonding of particles having the same composition as the crystalline inorganic binder.

In the present embodiment, the crystalline inorganic binder may be selected depending on the type of the phosphor used. By combination of a phosphor and a crystalline inorganic binder having different ionic radius, reaction between the phosphor and the crystalline inorganic binder during sintering can be suppressed, and a sintered phosphor-composite having a high internal quantum efficiency can be obtained.

Since a fluoride has a lower melting point than a nitride or an oxide, the sintering temperature can be reduced by selecting a fluoride as the inorganic binder. Thus, from the viewpoint of reduction of deterioration of the phosphor to be dispersed in the inorganic binder during the sintering of the inorganic binder, a fluoride inorganic binder is preferably used.

(Physical Properties of Crystalline Inorganic Binder Particles)

The description in the "Fluoride Inorganic Binder Particles" section for the description of the first embodiment is applied herein.

[Production Method for Sintered Phosphor-Composite]

By using, as major raw materials, the phosphor and the crystalline inorganic binder particles, and subjecting their mixture to compaction and sintering, a sintered phosphor-composite can be produced as a composite of these materials. The production method therefor is not limited. A more preferred production method is described below.

Specific examples of the production method include the following (Process 1) and (Process 2):

(Process 1) a process of stirring and mixing a phosphor and inorganic binder particles, performing pressing into a compact, and then sintering the compact; and (Process 2) a process of stirring and mixing a phosphor and inorganic binder particles, and then performing pressing and sintering at the same time.

(Process 1, Process 2)

The descriptions in the "Process 1" section and the "Process 2" section for the description of the first embodiment are applied herein.

{Physical Properties of Sintered Phosphor-Composite}

The sintered phosphor-composite according to one embodiment of the present embodiment (including a plate-shaped sintered phosphor-composite; the same applies hereinafter) is a sintered phosphor-composite comprising a phosphor and a crystalline inorganic binder, wherein the sintered phosphor-composite comprises at least a portion in which voids of not more than 1 μm are present usually in a number (which may be hereinafter simply referred to as "void number") of not more than 550 within an area of 0.046 mm$^2$ as observed by cross-sectional observation of the sintered phosphor-composite. The sintered phosphor-composite comprises at least a portion having the void number of preferably not more than 500, more preferably not more than 400, still more preferably not more than 300, especially preferably not more than 200. Although the portion showing such a small number of voids only needs to be at least part of the sintered phosphor-composite, it is preferred for the sintered phosphor-composite to show such a small number of voids in not less than half thereof, and it is more preferred for the sintered phosphor-composite to show such a small number of voids in its entirety. In general, the size of each void is not more than 5 μm, and most of the voids have a size of not more than 1 μm. Since voids of not less than 1 μm are often formed by joining of a plurality of sub-micron voids together during the sintering, the number of voids with a size of more than 1 μm is smaller than the number of sub-micron voids.

That is, since voids of not more than 1 μm are formed more frequently, they have a larger impact on properties of the sintered phosphor-composite. Moreover, since voids having almost the same diameter as the LED emission wavelength 450 nm are more likely to cause scattering of light from the LED, voids larger than 1 μm make only a relatively small contribution to the scattering. Therefore, calculation of the number of voids was carried out focusing especially on voids of not more than 1 μm.

As the number of voids decreases, the translucency can be increased more advantageously. Therefore, there is no lower limit of the number of voids. Usually, however, the number is larger than 0.

A sintered phosphor-composite according to another embodiment of the present embodiment is a sintered phosphor-composite comprising a nitride phosphor and a fluoride inorganic binder, wherein the sintered phosphor-composite comprises at least a portion having a void area fraction of usually not more than 0.3% within an area of 0.046 mm$^2$ as observed by cross-sectional observation of the sintered phosphor-composite. The sintered phosphor-composite comprises at least a portion having a void area fraction of preferably not more than 0.2%, more preferably not more than 0.1%. Although the portion showing such a small void area fraction only needs to be at least part of the sintered phosphor-composite, it is preferred for the sintered phosphor-composite to show such a small void area fraction in not less than half thereof, and it is more preferred for the sintered phosphor-composite to show such a small void area fraction in its entirety.

As the void area fraction decreases, the translucency can be increased more advantageously. Therefore, there is no lower limit of the void area fraction. Usually, however, the void area fraction is not less than 0.

The present inventors inferred that, in cases where the number of voids and/or the void area fraction in the sintered phosphor-composite is/are within these ranges, that is, in cases where the abundance of voids themselves in the sintered phosphor-composite is reduced, the translucency of the sintered phosphor-composite can be improved, and the light-emitting efficiency of the LED light-emitting device can be improved.

[Methods for Measuring Number of Voids and Void Area Fraction]

By subjecting the sintered phosphor-composite to a cross-section cutting process, and observing the cross-section with a scanning electron microscope (SEM), the number of voids and the void area fraction can be measured. After the cutting process and prior to the observation of the cross-section with an SEM, the cross-sectional surface may be or may not be polished. More specifically, the cross-section was observed at a magnification of 100, and then a typical area was selected, followed by acquiring binary images from two locations at a magnification of 500. For binary images of the SEM images at a magnification of 500, 5 locations in each image at a magnification of 500, that is, a total of 10 locations in the two images, were selected from the area excluding the evident grain boundary portions, and the diameter, the number, and the area of the black portions that could be recognized as voids were determined for each location. From the number of voids determined, the number of voids per 0.046 mm² was calculated. From the number of voids per 0.046 mm² determined for each of the 10 locations, the weight average value of the area of the measured region was calculated. The void diameter was determined from the area recognized as a void obtained by the binary processing, under the assumption that each void has a shape of a true circle.

As described above, in FIG. 3, each black portion corresponds to a void in the SEM image. Representative voids are indicated with broken lines.

[Cause of Production of Effect]

The description in the "Cause of Production of Effect" section for the description of the first embodiment is applied herein.

[Control of Number of Voids and Void Area Fraction]

The description in the "Control of Number of Voids and Void Area Fraction" section for the description of the first embodiment is applied herein.

[Properties of Sintered Phosphor-Composite]

The description in the "Properties of Sintered Phosphor-Composite" section for the description of the first embodiment is applied herein.

Third Embodiment

The third embodiment of the present invention includes the following inventions.

<3-1> A sintered phosphor-composite comprising a nitride phosphor and a fluoride inorganic binder,
wherein the fluoride inorganic binder has an average grain size of not more than 500 μm.

<3-2> The sintered phosphor-composite according to <3-1>, wherein the nitride phosphor has an average grain size of not less than 1 μm.

<3-3> A sintered phosphor-composite comprising a nitride phosphor and a fluoride inorganic binder,
wherein the nitride phosphor has an average grain size of 1 μm to 50 μm.

<3-4> The sintered phosphor-composite according to any one of <3-1> to <3-3>, wherein the nitride phosphor comprises a phosphor having a crystalline phase represented by the following Formula [1]:

$$Ln_xSi_6N_yMz \quad [1]$$

(in Formula [1],

Ln represents one or more elements selected from a group consisting of rare earth elements excluding an element(s) used as an activation element(s);

M represents one or more elements selected from a group consisting of activation elements; and x, y, and z each independently represent a value satisfying the following formulae:

$$2.7 \leq x \leq 3.3;$$

$$10 \leq y \leq 12; \text{ and}$$

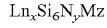

$$0 < z \leq 1.0).$$

<3-5> The sintered phosphor-composite according to any one of <3-1> to <3-4>, wherein the nitride phosphor comprises a phosphor having a crystalline phase represented by (Ca, Sr, Ba, Mg) AlSiN$_3$:Eu.

<3-6> A light-emitting device comprising the sintered phosphor-composite according to any one of <3-1> to <3-5>, and an LED or a semiconductor laser as a light source, wherein the sintered phosphor-composite absorbs at least part of light from the light source to emit light having a different wavelength.

<3-7> A lighting device comprising the light-emitting device according to <3-6>.

<3-8> A vehicle indicator lamp comprising the light-emitting device according to <3-6>.

{Sintered Phosphor-Composite}

The sintered phosphor-composite according to the present embodiment is a sintered phosphor-composite comprising a nitride phosphor and a fluoride inorganic binder, wherein the average grain size in the sintered phosphor-composite is within a particular range, and wherein voids are reduced.

[Form of Sintered Phosphor-Composite, Nitride Phosphor]

The descriptions in the "Form of Sintered Phosphor-Composite" section and the "Nitride Phosphor" section for the description of the first embodiment are applied herein.

[Fluoride Inorganic Binder]

The description in the "Fluoride Inorganic Binder" section for the description of the first embodiment is applied herein. However, the fluoride inorganic binder is especially preferably CaF$_2$. Regarding the volume median diameter of the fluoride inorganic binder particles, the sintered phosphor-composite of the present embodiment can be obtained by using particles having almost the same volume median diameter as, or having a smaller volume median diameter than, that of the nitride phosphor.

[Garnet-Based Phosphor]

The description in the "Garnet-based Phosphor That Emits Yellow or Green Light" section for the description of the first embodiment is applied herein.

[Production Method for Sintered Phosphor-Composite]

The description in the "Production Method for Sintered Phosphor-Composite" section for the description of the first embodiment is applied herein.

However, in the "stirring and mixing step" of "Process 1", the inorganic binder particles may be preliminarily subjected to heat treatment in order to prevent the gas generated during the sintering from being left as pores. In cases where the preliminary heat treatment is carried out, the treatment is carried out at a temperature of usually not less than 300° C., preferably not less than 400° C., and not more than 1100° C., preferably not more than 1000° C., for usually not less than 0.5 hours, preferably not less than 1 hour, and not more than 24 hours, preferably not more than 12 hours.

The "sintering step" of "Process 1" is carried out as follows.

By sintering the compact obtained through the molding step and/or the degreasing step, a sintered phosphor-composite is obtained. The process used for the sintering is not limited as long as a desired temperature and pressure can be realized. For example, a shuttle furnace; tunnel furnace; lead hammer furnace; rotary kiln; reaction vessel such as an autoclave; Tammann furnace; Acheson furnace; hot press apparatus; pulse current pressure sintering apparatus; hot isostatic press sintering apparatus; or pressurized atmosphere furnace; may be used. Regarding the heating method, high-frequency induction heating, direct resistance heating, indirect resistance heating, direct combustion heating, radiant heating, electrical heating, or the like may be used. In this process, stirring may be carried out, when necessary. The atmosphere for the sintering treatment is not limited. The treatment is preferably carried out under air atmosphere, under N$_2$ atmosphere, under Ar atmosphere, under vacuum, under air flow, under N$_2$ flow, under Ar flow, under air pressure, under N$_2$ pressure, or under Ar pressure. H$_2$ may be introduced into the atmospheric gas as appropriate. The sintering treatment temperature is usually not less than 300° C., preferably not less than 400° C., more preferably not less than 500° C., and usually not more than 1900° C., preferably not more than 1500° C., more preferably not more than 1300° C., although the optimum temperature range may vary depending on the inorganic binder used. The sintering temperature is a temperature lower than the melting point of the used fluoride inorganic binder usually by 50° C. or more, preferably by 100° C. or more, and more preferably 150° C. or more. Here, the melting point of calcium fluoride ($CaF_2$) is 1418° C., and the melting point of strontium fluoride ($SrF_2$) is 1477° C. The sintering treatment may be carried out in an atmosphere under pressurization. In such a case, the pressurized atmosphere may be at 0.05 MPa. The pressurized atmosphere is preferably at not less than 0.1 MPa, more preferably at not less than 0.5 MPa. After the molding step and prior to the sintering, a degassing step may be carried out at a temperature lower than the sintering temperature The heating rate during the firing is usually not more than 10° C./minute, preferably not more than 2.5° C./minute, more preferably not more than 1° C./minute. In cases where the heating time is short, the sintering proceeds before the removal of the gas generated from the raw materials, which may cause a decrease in the degree of sintering. Instead of the control of the heating rate, a temperature lower than the peak firing temperature may be maintained followed by performing firing at an increased temperature, or prefiring may be carried out at a temperature lower than the peak firing temperature as a degassing treatment step.

The sintering treatment time is usually not less than 0.1 hours, preferably not less than 0.5 hours, more preferably not less than 1 hour, and usually not more than 6 hours, preferably not more than 5 hours, more preferably not more than 4 hours. In cases where the treatment temperature and/or the treatment time is below this range, the organic component cannot be sufficiently removed, while in cases where it is above this range, degradation of the surface of the phosphor such as oxidation occurs, causing deterioration of light emission properties.

In the sintering step, the thermal history temperature conditions, heating rate, cooling rate, heat treatment time, and the like may be appropriately set. It is also possible to increase the temperature to a predetermined value after performing heat treatment within a relatively low temperature range. The reaction device used in this step may be either for a batch method or for a continuous method. Either a single device or a plurality of devices may be used.

The compact once obtained in the sintering step may be further subjected to sintering. Examples of the process used for the sintering include, but are not limited to, use of a hot isostatic press sintering apparatus.

In the sintering step, a sintering aid may be used as appropriate. Examples of the sintering aid used for the sintering step include, but are not limited to, MgO, $Y_2O_3$, CaO, $Li_2O$, BaO, $La_2O_3$, $Sm_2O_3$, $Sc_2O_3$, $ZrO_2$, $SiO_2$, $MgAl_2O_4$, LiF, NaF, BN, AlN, $Si_3N_4$, Mg, Zn, Ni, W, $ZrB_2$, $H_2$, Ti, and Mn. Two or more of these may be used as a mixture.

The "pressure sintering step" of "Process 2" is carried out as follows.

The mixed powder of the nitride phosphor or the like and the inorganic binder particles obtained by the stirring and mixing step is heated under pressure to obtain a sintered phosphor-composite. The furnace to be used for the pressure sintering is not limited as long as a desired temperature and pressure can be realized. For example, a hot press apparatus, a pulse current pressure sintering apparatus, or a hot isostatic press sintering apparatus may be used. Regarding the heating method, high-frequency induction heating, direct resistance heating, indirect resistance heating, direct combustion heating, radiant heating, electrical heating, or the like may be used. The atmosphere for the pressure sintering treatment is not limited. The treatment is preferably carried out under air atmosphere, under $N_2$ atmosphere, under Ar atmosphere, under vacuum, under air flow, under $N_2$ flow, under Ar flow, under air pressure, under $N_2$ pressure, or under Ar pressure. $H_2$ may be introduced into the atmospheric gas as appropriate. The sintering treatment temperature is usually not less than 300° C., preferably not less than 400° C., more preferably not less than 500° C., and usually not more than 1900° C., preferably not more than 1500° C., more preferably not more than 1300° C., still more preferably not more than 1000° C., although the optimum temperature range may vary depending on the inorganic binder used. The sintering temperature is a temperature lower than the melting point of the used fluoride inorganic binder usually by 50° C. or more, preferably by 100° C. or more, and more preferably 150° C. or more. Here, the melting point of calcium fluoride ($CaF_2$) is 1418° C., and the melting point of strontium fluoride ($SrF_2$) is 1477° C.

The sintering treatment time is usually not less than 0.1 hours, preferably not less than 0.5 hours, more preferably not less than 1 hour, and usually not more than 6 hours, preferably not more than 5 hours, more preferably not more than 4 hours.

The pressing pressure is usually not less than 1 MPa, preferably not less than 5 MPa, more preferably not less than 10 MPa, and usually not more than 1000 MPa, preferably not more than 800 MPa, more preferably not more than 600 MPa. In cases where the pressure during the molding is too low, a compact cannot be obtained, while in cases where the pressure is too high, the phosphor is mechanically damaged, causing deterioration of light emission properties.

In the press sintering step, the thermal history temperature conditions, heating rate, cooling rate, heat treatment time, and the like may be appropriately set. It is also possible to increase the temperature to a predetermined value after performing heat treatment within a relatively low temperature range. The reaction device used in this step may be either for a batch method or for a continuous method. Either a single device or a plurality of devices may be used.

In the sintering step, a sintering aid may be used as appropriate. Examples of the sintering aid used for the sintering step include, but are not limited to, MgO, $Y_2O$, CaO, $Li_2O$, BaO, $La_2O_3$, $Sm_2O_3$, $Sc_2O_3$, $ZrO_2$, $SiO_2$, $MgAl_2O_4$, LiF, NaF, BN, AlN, $Si_3N_4$, Mg, Zn, Ni, W, $ZrB_2$, $H_2$, Ti, and Mn. Two or more of these may be used as a mixture.

Although the sintered phosphor-composite obtained may be used as it is, it is usually sliced to a predetermined thickness, and then processed into a plate shape having a predetermined thickness by grinding and polishing, to obtain a plate-shaped sintered phosphor-composite. The grinding and polishing conditions are not limited. For example, the sintered phosphor-composite is polished using a #800 diamond grindstone at a grindstone rotation speed of 80 rpm and a work rotation speed of 80 rpm at 50 g/cm² for processing into a plate shape. The final thickness of the sintered phosphor-composite is usually not less than 30 μm, preferably not less than 50 μm, more preferably not less than 100 μm regarding the lower limit, and usually not more than 2000 μm, preferably not more than 1000 μm, more preferably not more than 800 μm, still more preferably not more than 500 μm regarding the upper limit. In cases where the thickness of the sintered phosphor-composite plate is below this range, breakage easily occurs, while in cases where the thickness exceeds this range, transmission of light is inhibited.

Further, after polishing the surface as appropriate, the surface may be subjected to irregularity processing by a wet etching process, dry-wet etching process, or the like.

{Physical Properties of Sintered Phosphor-Composite}

The sintered phosphor-composite according to one embodiment of the present embodiment (including a plate-shaped sintered phosphor-composite; the same applies hereinafter) is a sintered phosphor-composite comprising a nitride phosphor and a fluoride inorganic binder, wherein the fluoride inorganic binder has an average grain size of usually not more than 500 μm, preferably not more than 300 μm, more preferably not more than 100 μm. The grain size is usually larger than 0.

The sintered phosphor-composite according to another embodiment of the present embodiment is a sintered phosphor-composite comprising a nitride phosphor and a fluoride inorganic binder, wherein the nitride phosphor has an average grain size of usually not less than 1 μm, preferably not less than 3 μm, more preferably not less than 5 μm, and usually not more than 50 μm, preferably not more than 40 μm, more preferably not more than 30 μm.

In cases where the grain size of the fluoride inorganic binder and/or the nitride phosphor in the sintered phosphor-composite is/are within this range, the internal quantum efficiency and the transmittance of the sintered phosphor-composite obtained are high, which is preferred.

[Method for Measuring Average Grain Sizes of Fluoride Inorganic Binder and Nitride Phosphor]

By subjecting the sintered phosphor-composite to a cross-section cutting process, and observing the cross-section with a scanning electron microscope (SEM), the grain size can be measured. More specifically, the cross-section was observed at a low magnification, and then a typical area was selected, followed by measurement at a magnification of 100. The Feret diameter (side lengths of the circumscribed rectangle) in the horizontal direction and in the vertical direction with respect to each grain were measured, and their average was determined as the grain size. For the fluoride inorganic binder, the number of grains extracted is appropriately set such that statistical significance is secured. It is preferred to extract 100 or more grains in the image to calculate the average. For the nitride phosphor, it is preferred to extract all visually observable grains to calculate the average.

Figure 5:
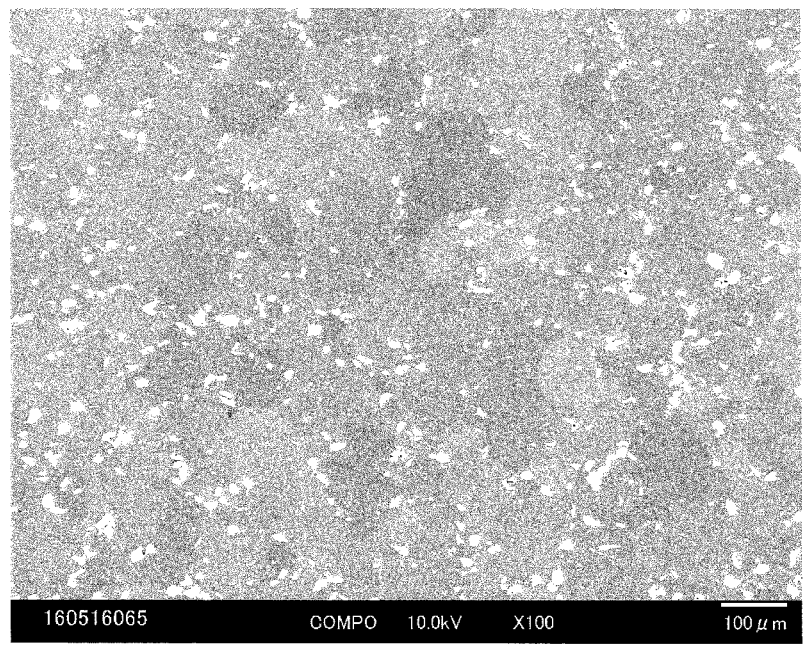
FIG. 5 is an SEM image of a cross-section of a sintered phosphor-composite prepared in Example 3-1 (drawing-substituting photograph).
Figure 6:
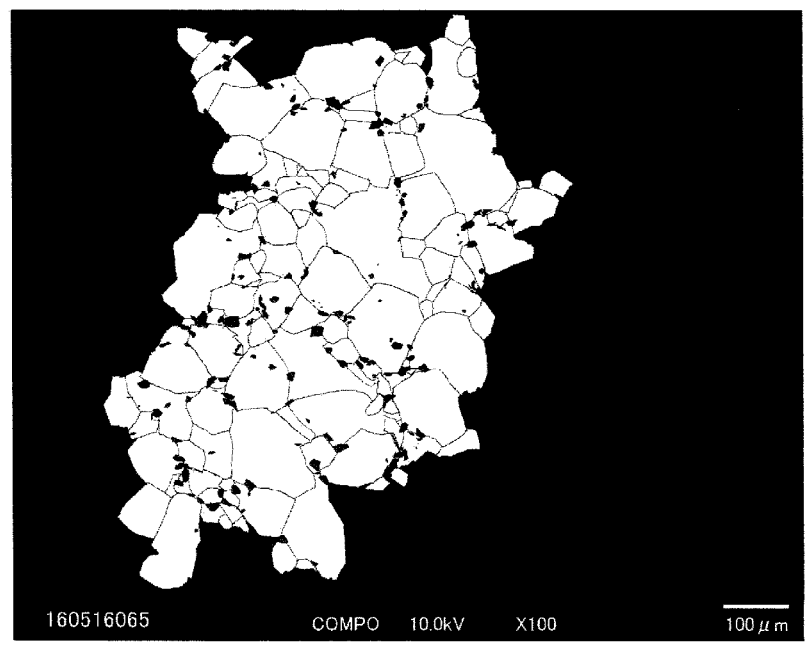
FIG. 6 is an SEM image of a cross-section of a sintered phosphor-composite prepared in Example 3-1, wherein 124 grains of the fluoride inorganic binder ($CaF_2$) extracted from FIG. 5 are shown. Each light-colored area surrounded by a black area(s) and a line(s) corresponds to one grain (drawing-substituting photograph).
Figure 7:
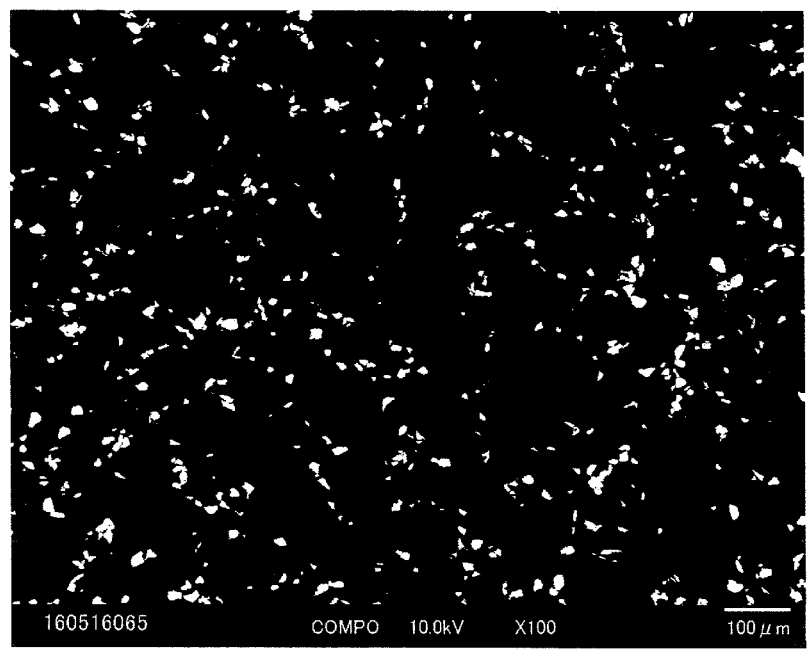
FIG. 7 is an SEM image of a cross-section of a sintered phosphor-composite prepared in Example 3-1, wherein all of the 595 visually observable grains of the nitride phosphor in FIG. 5 are shown. Each light-colored area corresponds to one grain (drawing-substituting photograph).

In FIG. 6, each light-colored area surrounded by a black area(s) and a line(s) extracted from FIG. 5 corresponds to one grain of the fluoride inorganic binder ($CaF_2$), and 124 grains extracted are shown. On the other hand, in FIG. 7, each light-colored area corresponds to one nitride phosphor grain, and 595 visually observable grains extracted are shown.

[Cause of Production of Effect]

The present inventors assume that the reason why a sintered phosphor-composite having excellent light emission properties can be obtained by setting the grain size of the sintered phosphor-composite within the above-described range in the present embodiment is as follows.

In cases where the grain size of the fluoride inorganic binder is above this range, gaps are more likely to be formed on the interface with the nitride phosphor, causing light scattering. This may lead to a low translucency and a low mechanical strength. On the other hand, in cases where the grain size of the nitride phosphor is within this range, the light-emitting efficiency is high, and the dispersibility of the phosphor is favorable. Therefore, uniform quality and an improved yield can be achieved.

More preferably, the grain size of the fluoride inorganic binder and the grain size of the nitride phosphor in the sintered phosphor-composite are both within the ranges described above.

[Control of Grain Sizes]

The grain size of the fluoride inorganic binder and the grain size of the nitride phosphor in the sintered phosphor-composite within the ranges described above can be achieved by controlling the particle size of the fluoride inorganic binder particles to be used as a raw material, the particle size of the nitride phosphor particles to be used as a raw material, the sintering temperature, the sintering time, the press pressure, the organic binder, the sintering aid, and/or the like as appropriate.

More specifically, the control is carried out as follows.

To provide a sintered phosphor-composite of the present embodiment, the fluoride inorganic binder and the nitride phosphor need to be joined together across an interface. This is achieved by, for example, a method using a fluoride inorganic binder having a particle size smaller than the particle size of the nitride phosphor.

As the particle size of the fluoride inorganic binder decreases, the gaps between the fluoride inorganic binder and the nitride phosphor become small. Further, as the particle size of the fluoride inorganic binder decreases, the specific surface area increases, leading to an increased reactivity and better growth of crystals. From such a viewpoint, the combination of the particle sizes of the fluoride inorganic binder and the nitride phosphor is determined, and the sintering conditions are controlled as appropriate in accordance therewith.

The organic binder allows better dispersion of the phosphor in the fluoride inorganic binder, and therefore the phosphor can be more easily surrounded by the inorganic binder. As a result, the gaps between the inorganic binder and the phosphor become smaller. This allows control of the grain sizes.

Further, in cases where a sintering aid is added, crystal growth of the inorganic binder is improved. This allows easier control of the grain sizes.

[Properties of Sintered Phosphor-Composite]

The description in the "Properties of Sintered Phosphor-Composite" section for the description of the first embodiment, except for the description on the "Contained Elements", is applied herein.

{Light-Emitting Device}

Another embodiment of the present invention is a light-emitting device comprising a sintered phosphor-composite or a plate-shaped sintered phosphor-composite, and a semiconductor light-emitting element. When the "light-emitting device according to the present embodiment" is mentioned below, the sintered phosphor-composite or the plate-shaped sintered phosphor-composite means one or more selected from the group consisting of the sintered phosphor-composites according to the first to third embodiments described above.

The light-emitting device according to the present embodiment at least comprises a blue semiconductor light-emitting element (blue light-emitting diode or blue semiconductor laser), and a sintered phosphor-composite or a plate-shaped sintered phosphor-composite as a wavelength conversion member that converts the wavelength of the blue light. The blue semiconductor light-emitting element and the sintered phosphor-composite or the plate-shaped sintered phosphor-composite may be either in close contact with each other or separated from each other. They may have a transparent resin therebetween, or a space may be formed therebetween. As shown by the schematic diagram in FIG. 1, the light-emitting device preferably has a structure in which a space is formed between the semiconductor light-emitting element and the sintered phosphor-composite.

The configuration of the device is described below using FIG. 1 and FIG. 2.

Figure 2:
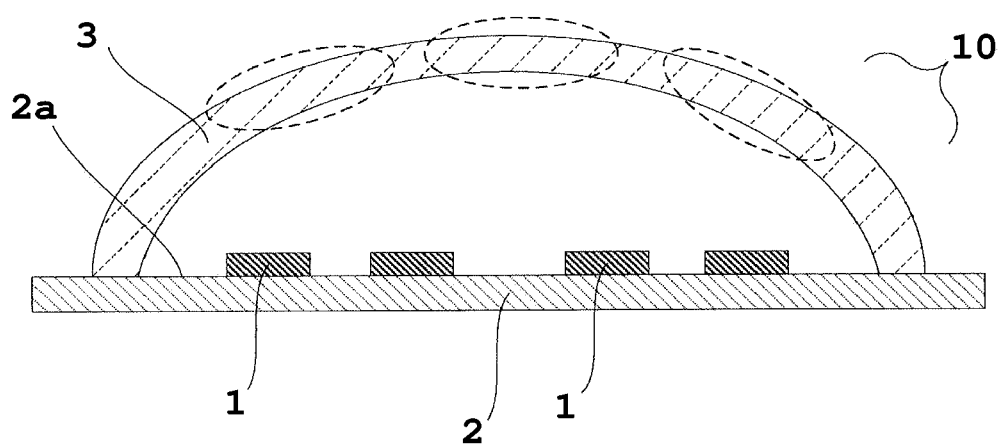
FIG. 2 is a schematic diagram showing an example of configuration of a semiconductor light-emitting device according to an embodiment of the present invention.

FIG. 2 is a schematic diagram showing a light-emitting device according to a specific embodiment of the present embodiment.

A light-emitting device 10 comprises at least a blue semiconductor light-emitting element 1 and a plate-shaped sintered phosphor-composite 3 as constituting members. The blue semiconductor light-emitting element 1 emits an excitation light for excitation of a phosphor contained in the plate-shaped sintered phosphor-composite 3.

The blue semiconductor light-emitting element 1 usually emits an excitation light having a peak wavelength of 425 nm to 475 nm, preferably emits an excitation light having a peak wavelength of 430 nm to 470 nm. The number of the blue semiconductor light-emitting element 1 may be appropriately set depending on the intensity of the excitation light required by the device.

Instead of the blue semiconductor light-emitting element 1, a violet semiconductor light-emitting element may be used. The violet semiconductor light-emitting element usually emits an excitation light having a peak wavelength of 390 nm to 425 nm, preferably emits an excitation light having a peak wavelength of 395 to 415 nm.

The blue semiconductor light-emitting element 1 is mounted on a chip-mounting surface 2a of a circuit board 2. On the circuit board 2, a circuit pattern (not shown) for supplying an electrode for the blue semiconductor light-emitting element 1 is formed to constitute an electric circuit. Although FIG. 2 shows a mode in which the plate-shaped sintered phosphor-composite 3 is placed on the circuit board 2, the mode is not limited thereto, and the circuit board 2 and the plate-shaped sintered phosphor-composite 3 may be arranged separately through another member.

For example, in FIG. 1, the circuit board 2 and the plate-shaped sintered phosphor-composite 3 are arranged separately through a frame body 4. The frame body 4 may be in a tapered shape in order to impart directionality to light. The frame body 4 may be a reflective material.

From the viewpoint of increasing the light-emitting efficiency of the light-emitting device 10, the circuit board 2 preferably has excellent electric insulation properties and favorable heat-radiating properties, and also a high reflectance. On an area where the blue semiconductor light-emitting element 1 is absent on the chip-mounting surface of the circuit board 2, or on at least part of the inner surface of the other member that connects the circuit board 2 to the plate-shaped sintered phosphor-composite 3, a reflector having a high reflectance may be provided.

The plate-shaped sintered phosphor-composite 3 converts the wavelength of part of the incident light emitted by the blue semiconductor light-emitting element 1 to emit an outgoing light having a wavelength different from that of the incident light.

In a mode in which a nitride phosphor according to the first or third embodiment is used, the plate-shaped sintered phosphor-composite 3 comprises an inorganic binder and a nitride phosphor. The types of the nitride phosphor (not shown), or the garnet-based phosphor that emits yellow or green light and the nitride phosphor that emits red light are not limited. In cases where the light-emitting device is a white-light-emitting device, the type of each phosphor may be appropriately controlled such that a white light is emitted in accordance with the type of the excitation light from the semiconductor light-emitting element.

In a mode in which a phosphor according to the second embodiment is used, the plate-shaped sintered phosphor-composite 3 comprises a crystalline inorganic binder and the phosphor. The types of the phosphor (not shown) and the phosphor that emits red light are not limited. In cases where the light-emitting device is a white-light-emitting device, the type of each phosphor may be appropriately controlled such that a white light is emitted in accordance with the type of the excitation light from the semiconductor light-emitting element.

In a mode in which a nitride phosphor according to the first or third embodiment is used, when the semiconductor light-emitting element is a blue semiconductor light-emitting element, a yellow phosphor may be used as the nitride phosphor, or a yellow phosphor or a green phosphor may be used as the garnet-based phosphor, and a red phosphor may be used as the nitride phosphor, to provide a light-emitting device that emits white light.

In a mode in which a phosphor according to the second embodiment is used, when the semiconductor light-emitting element is a blue semiconductor light-emitting element, a yellow phosphor may be used as the phosphor, or a yellow phosphor or a green phosphor may be used as the garnet-based phosphor, and a red phosphor may be used as the phosphor, to provide a light-emitting device that emits white light.

In the mode using the nitride phosphor according to the first embodiment, and in the mode using the phosphor according to the second embodiment, a space may be formed between the plate-shaped sintered phosphor-composite 3 and the blue semiconductor light-emitting element 1, or a transparent resin may be provided therebetween. In cases where a space is formed between the plate-shaped sintered phosphor-composite 3 and the blue semiconductor light-emitting element 1, it is preferred to place a heat radiation mechanism that releases heat from the sintered phosphor-composite.

In a mode in which the nitride phosphor according to the third embodiment is used, the plate-shaped sintered phosphor-composite 3 is preferably at a distance from the blue semiconductor light-emitting element 1. A space may be formed between the plate-shaped sintered phosphor-composite 3 and the blue semiconductor light-emitting element 1, or a transparent resin may be provided therebetween. In cases where a space is formed between the plate-shaped sintered phosphor-composite 3 and the blue semiconductor light-emitting element 1, it is preferred to place a heat radiation mechanism that releases heat from the sintered phosphor-composite.

The light-emitting device according to the present embodiment is preferably a light-emitting device that radiates white light. In the light-emitting device that radiates white light, the light radiated from the light-emitting device preferably has a duv, light color deviation from the blackbody radiation locus, of −0.0200 to 0.0200, and a color temperature of 1800 K to 30,000 K.

A light-emitting device that emits white light in this mode can be preferably installed in a lighting device.

{Lighting Device}

Another embodiment of the present invention is a lighting device comprising the light-emitting device.

Since, as described above, emission at a high total luminous flux can be achieved with the light-emitting device, lighting apparatus showing a high total luminous flux can be obtained. In order to make the color of the plate-shaped sintered phosphor-composite less visible when the lighting apparatus is turned off, it is preferred to arrange a diffusion member that covers the plate-shaped sintered phosphor-composite in the light-emitting device.

{Vehicle Indicator Lamp}

Another embodiment of the present invention is a vehicle indicator lamp comprising the light-emitting device.

The light-emitting device used for the vehicle indicator lamp is preferably a light-emitting device that radiates white light. In the light-emitting device that radiates white light, the light radiated from the light-emitting device preferably has a duv, light color deviation from the blackbody radiation locus, of −0.0200 to 0.0200, and a color temperature of 5000 K to 30,000 K.

The vehicle indicator lamp includes lamps installed in vehicles for the purpose of providing certain indication to other vehicles or persons, such as vehicle headlights, side lamps, tail lamps, blinkers, brake lamps, and fog lamps.

EXAMPLES

Specific modes of the present invention are described below in more detail by way of Examples, but the present invention is not limited by these examples.

First Embodiment

[Measurement Method]

The degree of sintering, the absorbance, the transmittance, the internal quantum efficiency, the number of voids, the void area fraction, the carbon and oxygen contents, and the optical properties in the present description were measured as follows.

(Degree of Sintering)

The degree of sintering was calculated by dividing the density of the sintered phosphor-composite measured by the Archimedes method $\rho_a$ by the theoretical density $\rho_{theoretical}$.

Degree of sintering (%)=$(\rho_a/\rho_{theoretical})\times 100$ (Voids)

By subjecting the sintered phosphor-composite to a cross-section cutting process, observing the cross-section with a scanning electron microscope (SEM), and then subjecting the obtained image to a binary processing, the number of voids and the void area fraction were measured. More specifically, the cross-section was observed at a magnification of 100, and then a typical area was selected, followed by measurement at a magnification of 500. In the binary SEM image, the void portions to be measured appear black. The diameters, the number, and the area of the black portions recognized as voids were determined for an area of 0.046 mm$^2$ in the measured image at a magnification of 500, which nearly corresponded to the viewing area when the measurement was carried out at a magnification of 500. The diameter of each void was determined by calculating the average of the vertical diameter and the horizontal diameter observed.

(Optical Properties: LED Evaluation)

A light-emitting device capable of allowing emission of light from a sintered phosphor-composite by radiation of blue light emitted from an LED chip (peak wavelength, 450 nm) was prepared. The emission spectrum of light emitted from the device was monitored using a 40-inch integrating sphere (manufactured by LabSphere, Inc.) and a spectroscope MCPD9000 (manufactured by Otsuka Electronics Co. Ltd.), and the color temperature chromaticity coordinates and the luminous flux (lumen) were measured by pulse excitation with a light having a radiant flux of 0.26 W. In addition, the conversion efficiency (lm/W) was calculated from the luminous flux (lumen) and the radiant flux (W) of the LED chip at each intensity.

(Optical Properties: Absorbance, Transmittance)

Subsequently, based on the reflectance and transmission spectra obtained by irradiation to the sintered phosphor-composite using, as a light source, a xenon spectral light source with an excitation wavelength of 700 nm, the absorbance and the transmittance of the sintered phosphor-composite at an excitation wavelength of 700 nm were measured.

(Optical Properties: Internal Quantum Efficiency Evaluation)

Subsequently, based on the reflectance and transmission spectra obtained by irradiation to the sintered phosphor-composite at an excitation wavelength of 450 nm, the internal quantum efficiency of the sintered phosphor-composite at an excitation wavelength of 450 nm was measured.

(Optical Properties: Reflectance and Transmission Spectra)

The reflectance and transmission spectra were monitored using a spectral light source (manufactured by Spectra Co-op) together with a 20-inch integrating sphere LMS-200 (manufactured by LabSphere, Inc.) and a spectroscope Solid Lambda UV-Vis (manufactured by Carl Zeiss).

(Analysis of Carbon/Oxygen)

Carbon analysis was carried out by the high-frequency furnace combustion-IR detection method, wherein a carbon-sulfur detector Type CS600 (manufactured by LECO Corporation) was used. In a porcelain crucible, 0.05 g of the sintered phosphor-composite, one dedicated spoon of Leco-cellII (manufactured by LECO Corporation) as a flux, and 0.4 g of iron were placed, the resulting mixture was heated under an oxygen gas flow of 3 L/min in the apparatus operated at an output of 100%.

Oxygen analysis was carried out under an inert atmosphere by the impulse furnace heat extraction-IR detection method, wherein a nitrogen-oxygen-hydrogen detector Type TCH600 (manufactured by LECO Corporation) was used. In a graphite crucible, a Ni capsule containing 0.1 g of the sintered phosphor-composite and one dedicated spoon of graphite powder were placed, and the resulting mixture was heated under a helium gas flow of 0.45 L/min in the apparatus operated at an output of 4800 W.

[Production of Sintered Phosphor-Composite]

Example 1-1

As a fluoride inorganic binder material for the sintered phosphor-composite, 2.0 g of CaF$_2$ powder (Hakushin Chemical Laboratory Co., Ltd.; microparticles of not more than 1 μm) was used, and, as a phosphor, an LSN phosphor (LaSi$_6$N$_{11}$:Ce) BY-201/G (manufactured by Mitsubishi Chemical Corporation) was used in an amount in which the phosphor concentration in the sintered body became 5% by volume. These were mixed together in a mortar. The resulting powder was dry-blended for 2 hours by rotation on a ball mill stand without balls, and then provided as a sintering raw material.

After placing 2.0 g of the raw material in a single-screw press die comprising an upper punch, a lower punch, and a cylindrical die (made of stainless steel, 20-mm diameter), a pressure was applied at 10 ton, and then the pressure was kept for 5 min to obtain a pellet having a diameter of 20 mm and a thickness of 3 mm.

The obtained pellet was vacuum-laminated, and then introduced into a cold isostatic pressing (CIP) apparatus (Nikkiso Co., Ltd.; rubber press), followed by pressurization at 300 MPa for 1 min. Thereafter, the pellet was introduced into a firing furnace (tube furnace) (Irie Corporation; tube furnace IRH), and heated at 10° C./min to 1200° C. The temperature was maintained for 60 min, and then the furnace was cooled to obtain a sintered body having a diameter of 20 mm and a thickness of 3 mm. The degree of sintering was measured by the Archimedes method at this time.

The obtained sintered phosphor-composite having a diameter of 20 mm and a thickness of 3 mm was cut to a thickness of about 0.5 mm using a diamond cutter, and then subjected to grinding using a grinder to prepare a plate-shaped sintered phosphor-composite having a diameter of 20 mm and a thickness of 0.2 mm. Using the plate-shaped sintered phosphor-composite, the transmittance at a wavelength of 700 nm, the absorbance, the number of voids, the void area, the internal quantum efficiency, the LED conversion efficiency (CE), the chromaticity coordinates (x, y), and the color temperature were measured.

Example 1-2

A sintered phosphor-composite was prepared by firing in the same manner as in Example 1-1, and then heated to 1100° C. by the hot isostatic pressing (HIP) method using a hot isostatic press sintering apparatus, followed by performing heat treatment by keeping the product under an Ar atmosphere at 100 MPa for 1 hour. Subsequently, a grinding process was carried out in the same manner as in Example 1-1, and optical evaluation was carried out in the same manner as in Example 1-1.

Example 1-3

A sintered phosphor-composite was prepared and evaluated in the same manner as in Example 1-2 except that the firing temperature for the sintering was 1000° C.

Example 1-4

A sintered phosphor-composite was prepared and evaluated in the same manner as in Example 1-2 except that the sintering was carried out by reducing the firing furnace pressure of the firing furnace (induction heating furnace manufactured by Dai-ichi Kiden Co., Ltd.) to 0.01 Pa or less, performing heating, increasing the temperature from 900° C. at a heating rate of 1° C./min, and then introducing $N_2$ at 1200° C. The thus prepared sintered phosphor-composite was subjected to analysis of carbon and oxygen impurities, and they were found to be 0.03 to 0.06 wt % and 0.16 to 0.18 wt %, respectively.

Example 1-5

A sintered phosphor-composite was prepared and evaluated in the same manner as in Example 1-4 except that the firing temperature for the sintering was 1000° C., that slow heating was carried out at 1° C./min from 600° C. to 1000° C., and that $N_2$ was introduced at 800° C.

Example 1-6

A sintered phosphor-composite was prepared and evaluated in the same manner as in Example 1-4 except that after the preparation of the pellet and prior to the firing, degassing treatment was carried out at 700° C. for 2 h under a vacuum of not more than 10 Pa, that firing was performed at 1000° C. in the sintering, and that slow heating was carried out at 1° C./min from 900° C.

Example 1-7

A sintered phosphor-composite was prepared and evaluated in the same manner as in Example 1-5 except that LYSN ((La,Y)$_3$Si$_6$N$_{11}$:Ce) BY-202/C (manufactured by Mitsubishi Chemical Corporation) was used instead of LSN as a phosphor, that 0.2 g of the phosphor was mixed with 2 g of $CaF_2$, that the firing temperature for the sintering was 1100° C., that slow heating was carried out at 1° C./min from 600° C. to 1000° C., that $N_2$ was introduced at 1100° C. and firing was performed, and that the resulting sintered body was processed into a thickness of 0.3 mm.

Example 1-8

A sintered phosphor-composite was prepared and evaluated in the same manner as in Example 1-4 except that 0.16 g and 0.02 g of LSN and CASN (CaAlSiN$_3$:Eu) BR-101A (manufactured by Mitsubishi Chemical Corporation), respectively, were mixed with 2 g of $CaF_2$ to prepare a compact in the same manner as in Example 1-1, and that in the sintering, the slow heating at 1° C./min was carried out only from 600 to 800° C. while the temperature was increased at 10° C./min in other temperature ranges, followed by introduction of a mixed gas of $N_2+H_2$ (4%) at 1200° C. to perform firing.

Example 1-9

A sintered phosphor-composite was prepared and evaluated in the same manner as in Example 1-8 except that 0.21 g and 0.02 g of LSN and SCASN (CaSrAlSiN$_3$:Eu) BR-102/S (manufactured by Mitsubishi Chemical Corporation), respectively, were mixed with 2 g of $CaF_2$.

Example 1-10

A sintered phosphor-composite was prepared and evaluated in the same manner as in Example 1-8 except that 0.13 g of SCASN (CaSrAlSiN$_3$:Eu) BR-102/S (manufactured by Mitsubishi Chemical Corporation) was mixed with 2 g of $CaF_2$.

The following Table 1 shows the degree of sintering, the number of voids, the internal quantum efficiency, the transmittance, and the absorbance of each of Examples 1-1 to 1-10.

Although the number of voids of not more than 1 μm and the void area fraction were not measured for the sintered phosphor-composites prepared in Examples 1-5 to 1-10, these sintered phosphor-composites can be assumed to have the same levels of these characteristics as those of Example 1-4 since they all had a degree of sintering of not less than 99%.

TABLE 1

The firing conditions, the degree of sintering, the optical properties, and the void area fraction of each of Examples 1-1 to 1-10

| Example | Nitride phosphor | Degree of sintering (%) | Void area fraction (%) | Number of voids of not more than 1 μm | Internal quantum efficiency (%) | Absorbance (%) | Transmittance (%) |
| --- | --- | --- | --- | --- | --- | --- | --- |
| 1-1 | LSN phosphor | 97.8 | 1.26 | 586 | 77 | 5 | 53 |
| 1-2 | LSN phosphor | 98.7 | 0.36 | 147 | 77 | 0 | 57 |
| 1-3 | LSN phosphor | 98.8 | 0.38 | 112 | 82 | 0 | 57 |
| 1-4 | LSN phosphor | 99.4 | 0.01 | 8 | 74 | 5 | 63 |
| 1-5 | LSN phosphor | 99.5 | | | 83 | 2 | 63 |
| 1-6 | LSN phosphor | 99.2 | | | 84 | 2 | 61 |
| 1-7 | LYSN phosphor | 99.4 | | | 85 | 2 | |
| 1-8 | LSN phosphor SCASN phosphor | 99.6 | | | 76 | | |
| 1-9 | LSN phosphor SCASN phosphor | 99.4 | | | 74 | | |
| 1-10 | SCASN phosphor | 98 | | | 82 | 3 | |

As shown in Table 1, the sintered phosphor-composites of the present embodiment have high internal quantum efficiencies and transmittances. The internal quantum efficiency is the efficiency of conversion of absorbed blue light to yellow light. In cases where the internal quantum efficiency is high, the conversion efficiency of the sintered phosphor-composite is high since the level of absorption of blue color that does not contribute to light emission is low. The transmittance represents how easily the light emitted from the phosphor can be transmitted. As the transmittance increases, the conversion efficiency increases. Thus, a light-emitting device using a sintered phosphor-composite of the present embodiment has a high light-emitting efficiency.

The following Table 2 shows LED properties of Examples 1-1 to 1-10.

TABLE 2

The LED properties of each of Examples 1-1 to 1-10

| Example | Nitride phosphor | x | y | Color temperature (K) | Conversion efficiency (lm/Wopt) |
| --- | --- | --- | --- | --- | --- |
| 1-1 | LSN phosphor | 0.342 | 0.377 | 5180 | 146 |
| 1-2 | LSN phosphor | 0.330 | 0.357 | 5603 | 150 |
| 1-3 | LSN phosphor | 0.314 | 0.335 | 6395 | 155 |
| 1-4 | LSN phosphor | 0.309 | 0.311 | 6904 | 146 |
| 1-5 | LSN phosphor | 0.308 | 0.322 | 6837 | 162 |
| 1-6 | LSN phosphor | 0.317 | 0.339 | 6223 | 163 |
| 1-7 | LYSN phosphor | 0.361 | 0.366 | 4508 | 165 |
| 1-8 | LSN phosphor SCASN phosphor | 0.361 | 0.371 | 4535 | 133 |
| 1-9 | LSN phosphor SCASN phosphor | 0.368 | 0.374 | 4337 | 136 |
| 1-10 | SCASN phosphor | 0.369 | 0.166 | 1574 | 39 |

Using the sintered phosphor-composites of the present embodiment, light-emitting devices for a high color temperature region of 5000 K or higher (Examples 1-1 to 1-6) and light-emitting devices for a low color temperature region of lower than 5000 K (Examples 1-7 to 1-10) were prepared. As shown in Table 2, the light-emitting devices using the sintered phosphor-composites whose voids were reduced by the method carried out in Example 1-5 or 1-6 showed especially high conversion efficiencies.

Second Embodiment

[Measurement Method]

For carrying out measurement of the degree of sintering, the absorbance, the transmittance, the internal quantum efficiency, the number of voids, the void area fraction, and the optical properties, measurement items other than the following measurement items were measured by the methods described in above first embodiment.

(Voids)

The sintered phosphor-composite was subjected to a cross-section cutting process, and then the surface was polished, followed by observation of the polished surface using a scanning electron microscope (SEM). By a binary processing of the obtained image, the number of voids with a diameter of not more than 1 μm and the void area fraction were measured.

More specifically, the cross-section was observed at a magnification of 100, and then a typical area was selected, followed by acquiring binary images from two locations at a magnification of 500. For the binary images at a magnification of 500, 5 locations in each image, that is, a total of 10 locations in the two images, were selected from the area excluding the evident grain boundary portions, and the diameters, the number, and the area of the black portions that could be recognized as voids were determined for each location. From the number of voids determined, the number of voids with a diameter of not more than 1 μm per 0.046 mm$^2$ was calculated. Based on the number of voids per 0.046 mm$^2$ determined for each of the 10 locations, the weight average value of the area of the measured region was calculated. The void diameter was determined from the area recognized as a void obtained by the binary processing, under the assumption that each void has a shape of a true circle.

(Optical Properties: Internal Quantum Efficiency Evaluation)

Based on the spectrum obtained by laser irradiation to the sintered phosphor-composite in an integrating sphere using a 448-nm laser as a light source, the internal quantum efficiency of the sintered phosphor-composite at an excitation wavelength of 448 nm was measured.

(Optical Properties: Transmittance)

Using a spectrophotometer U3310, manufactured by Hitachi High-Technologies Corporation, the transmittance of the sintered phosphor-composite at 700 nm was measured. The diameter of the measured spot was 1 mm.

[Production of Sintered Phosphor-Composite]

Comparative Example 2-1

A sintered phosphor-composite was produced in the same manner as in Example 1-1. Using the plate-shaped sintered phosphor-composite, the transmittance at a wavelength of 700 nm, the number of voids, the void area fraction, the internal quantum efficiency, the LED conversion efficiency (CE), and the chromaticity coordinates (x, y) were measured.

Comparative Example 2-2

A sintered phosphor-composite was prepared in the same manner as in Comparative Example 2-1 except that 0.15 g of YAG BY-102/H (manufactured by Mitsubishi Chemical Corporation) was used as a phosphor, and that the firing temperature was 1000° C. Evaluation was carried out in the same manner as in Comparative Example 2-1 except that grinding using a grinder was carried out to a thickness of 0.22 mm.

Comparative Example 2-3

A sintered phosphor-composite was prepared and evaluated in the same manner as in Comparative Example 2-2 except that 0.22 g of LuAG BG-801/C4 (manufactured by Mitsubishi Chemical Corporation) was used as a phosphor, and that the firing temperature was 1200° C.

Example 2-1

A sintered phosphor-composite was prepared by firing in the same manner as in Comparative Example 2-1, and then heated to 1100° C. by the hot isostatic pressing (HIP) method using a hot isostatic press sintering apparatus, followed by performing heat treatment by keeping the product under an Ar atmosphere at 100 MPa for 1 hour. Subsequently, a grinding process was carried out in the same manner as in Comparative Example 2-1, and optical evaluation was carried out in the same manner as in Comparative Example 2-1.

Example 2-2

A sintered phosphor-composite was prepared and evaluated in the same manner as in Example 2-1 except that the firing temperature for the sintering was 1000° C.

Example 2-3

A sintered phosphor-composite was prepared and evaluated in the same manner as in Example 2-2 except that 0.22 g of YAG BY-102/H (manufactured by Mitsubishi Chemical Corporation) was used as a phosphor, and that grinding using a grinder was carried out to a thickness of 0.22 mm.

Example 2-4

A sintered phosphor-composite was prepared and evaluated in the same manner as in Example 2-3 except that the heating in the sintering was carried out under vacuum atmosphere.

Example 2-5

A sintered phosphor-composite was prepared and evaluated in the same manner as in Example 2-4 except that the heating rate during the heating in the sintering was 1° C./min at not less than 600° C.

Example 2-6

A sintered phosphor-composite was prepared and evaluated in the same manner as in Example 2-2 except that 0.22 g of LuAG BG-801/04 (manufactured by Mitsubishi Chemical Corporation) was used as a phosphor, and that grinding using a grinder was carried out to a thickness of 0.22 mm.

Example 2-7

A sintered phosphor-composite was prepared and evaluated in the same manner as in Example 2-6 except that the heating in the sintering was carried out under vacuum atmosphere.

Example 2-8

A sintered phosphor-composite was prepared and evaluated in the same manner as in Example 2-7 except that the heating rate during the heating in the sintering was 1° C./min at not less than 600° C.

TABLE 3

| | Phosphor | Prefiring Firing temperature (° C.) | Heating rate (° C./min) | Heating atmosphere | HIP temperature (° C.) | Degree of sintering (%) | Internal quantum efficiency (%) | Transmittance (%) 700 nm | Void area fraction (%) | Number of voids |
|---|---|---|---|---|---|---|---|---|---|---|
| Comparative Example 2-1 | LSN | 1200 | 10 | N2 | none | 97.8 | 77 | 40 | 0.4 | 651 |
| Example 2-1 | | 1200 | 10 | N2 | 1100 | 98.7 | 77 | 49 | 0.1 | 253 |
| Example 2-2 | | 1000 | 10 | N2 | 1100 | 98.8 | 82 | 49 | 0.0 | 127 |
| Comparative Example 2-2 | YAG | 1000 | 10 | N2 | none | 93.7 | 87 | 31 | 1.6 | 1373 |
| Example 2-3 | | 1000 | | | 1100 | 94.8 | 92 | 53 | 0.1 | 320 |
| Example 2-4 | | 1000 | | vac | | 98.5 | 94 | 62 | 0.0 | 170 |
| Example 2-5 | | 1000 | 1 | | | 99.1 | 93 | 66 | 0.1 | 364 |
| Comparative Example 2-3 | LuAG | 1200 | 10 | N2 | none | 96.0 | 78 | 36 | 0.7 | 738 |
| Example 2-6 | | 1000 | | | 1100 | 95.3 | 93 | 55 | 0.1 | 202 |
| Example 2-7 | | 1000 | | vac | | 99.2 | 92 | 59 | 0.0 | 191 |
| Example 2-8 | | 1000 | 1 | | | 98.6 | 93 | 67 | 0.0 | 108 |

As shown in Table 3, the sintered phosphor-composites of the present embodiment have high internal quantum efficiencies and transmittances. The internal quantum efficiency is the efficiency of conversion of absorbed blue light to yellow light. In cases where the internal quantum efficiency is high, the conversion efficiency of the sintered phosphor-composite is high since the level of absorption of blue color that does not contribute to light emission is low. The transmittance represents how easily the light emitted from the phosphor can be transmitted. As the transmittance increases, the conversion efficiency increases. Thus, a light-emitting device using a sintered phosphor-composite of the present embodiment has a high light-emitting efficiency.

The following Table 4 shows LED properties of Examples 2-1 to 2-8.

TABLE 4

| | Phosphor | LED evaluation | | |
| --- | --- | --- | --- | --- |
| | | Chromaticity coordinate x | Chromaticity coordinate y | CE |
| Comparative Example 2-1 | LSN | 0.342 | 0.377 | 146 |
| Example 2-1 | | 0.330 | 0.357 | 150 |
| Example 2-2 | | 0.314 | 0.335 | 155 |
| Comparative Example 2-2 | YAG | 0.350 | 0.412 | 114 |
| Example 2-3 | | 0.285 | 0.286 | 158 |
| Example 2-4 | | 0.300 | 0.317 | 154 |
| Example 2-5 | | 0.301 | 0.318 | 160 |
| Comparative Example 2-3 | LuAG | 0.272 | 0.341 | 132 |
| Example 2-6 | | 0.282 | 0.371 | 166 |
| Example 2-7 | | 0.276 | 0.352 | 163 |
| Example 2-8 | | 0.262 | 0.311 | 173 |

Light-emitting devices were prepared using the sintered phosphor-composites of the present embodiment. As shown in Table 4, the light-emitting devices using the sintered phosphor-composites whose voids were reduced by the preparation methods of Examples showed higher conversion efficiencies compared to those using the sintered bodies prepared in the Comparative Examples.

Third Embodiment

[Measurement Method]

For carrying out measurement of the degree of sintering, the grain size, the transmittance, the internal quantum efficiency, and the optical properties, measurement items other than the following measurement items were measured by the methods described in above first embodiment.

(Grain Size)

The obtained sintered phosphor-composite was subjected to a cross-section cutting process, and the cross-section was observed with a scanning electron microscope (SEM) to measure the grain size. Regarding the grain size of the fluoride inorganic binder, the cross-section was observed at a low magnification, and then a typical area was selected, followed by measurement at a magnification of 100. Each of not less than 100 grains was subjected to measurement of the Feret diameter (side lengths of the circumscribed rectangle) in the horizontal direction and in the vertical direction with respect to each grain, and their average was determined as the grain size. For the nitride phosphor, all visually observable grains were extracted to calculate the average.

Example 3-1

[Preparation of Sintered Phosphor-Composite]

As a fluoride inorganic binder material for the sintered phosphor-composite, 2.0 g of $CaF_2$ powder (Hakushin Chemical Laboratory Co., Ltd.; weight average median diameter, 0.5 μm) subjected to heat treatment at 600° C. for 60 min in air was used, and, as a phosphor, an LSN phosphor ($La_3Si_6N_{11}$:Ce) BY-201/G (manufactured by Mitsubishi Chemical Corporation) was used in an amount in which the phosphor concentration in the sintered body became 5% by volume. These were mixed together in a mortar. The resulting powder was dry-blended for 2 hours by rotation on a ball mill stand without balls, and then provided as a sintering raw material.

After placing 2.0 g of the raw material in a single-screw press die comprising an upper punch, lower punch, and cylindrical die (made of stainless steel, 20-mm diameter), a pressure was applied at 10 ton, and then the pressure was kept for 5 min, to obtain a pellet having a diameter of 20 mm and a thickness of 3 mm.

The obtained pellet was vacuum-laminated, and then introduced into a cold isostatic pressing (CIP) apparatus (Nikkiso Co., Ltd.; rubber press), followed by pressurization at 300 MPa for 1 min. Thereafter, the pellet was introduced into a firing furnace (induction heating furnace manufactured by Dai-ichi Kiden Co., Ltd.), and the furnace pressure was reduced to 0.01 Pa or less, followed by increasing the temperature at 10° C./min to 900° C., and then heated at 1° C./min to 1200° C. After the temperature reached 1200° C., $N_2$ was introduced, and the temperature was kept for 60 min, followed by cooling the furnace. The obtained sintered body was heated to 1100° C., kept under an Ar atmosphere at 100 MPa for 1 hour, and then treated with the hot isostatic pressing (HIP) method. The degree of sintering was measured by the Archimedes method at this time.

The obtained sintered phosphor-composite was cut to a thickness of about 0.5 mm using a diamond cutter, and then subjected to grinding using a grinder to prepare a plate-shaped sintered phosphor-composite having a thickness of 0.2 mm. The degree of sintering, the internal quantum efficiency, the transmittance at a wavelength of 700 nm, the grain size, the LED conversion efficiency, and the chromaticity coordinates measured using the plate-shaped sintered phosphor-composite are shown in Table 5 and Table 6.

Example 3-2

A pellet was prepared in the same manner as in Example 3-1 except that $CaF_2$ powder not subjected to heat treatment at 600° C. for 60 min was used as a fluoride inorganic binder. The pellet was introduced into a firing furnace (vertical quartz furnace), and the furnace pressure was reduced to not more than 30 Pa, followed by increasing the temperature at 5° C./min to 700° C., keeping the temperature for 2 h, and then cooling at 5° C./min. CIP was carried out in the same manner as in Example 3-1. The pellet was then introduced into a firing furnace (tube furnace), and then heated at 10° C./min to 1000° C. under $N_2$ flow, followed by maintaining the temperature for 60 min and then cooling the furnace. The obtained sintered body was subjected to a HIP process in the same manner as in Example 3-1, and then evaluated.

Example 3-3

A sintered phosphor-composite was prepared and evaluated in the same manner as in Example 3-2 except that CIP was not carried out.

TABLE 5

| | CaF$_2$ average grain size (μm) | Nitride phosphor average grain size (μm) | Degree of sintering (%) | Internal quantum efficiency (%) | Transmittance (%) |
|---|---|---|---|---|---|
| Example 3-1 | 57.5 (124 grains) | 10.8 (595 grains) | 99.4 | 78 | 65 |
| Example 3-2 | 32.9 (220 grains) | 10.4 (608 grains) | 99.0 | 83 | 65 |
| Example 3-3 | 41.9 (103 grains) | 10.8 (673 grains) | 99.2 | 85 | 62 |

The number of grains in the parentheses for each average grain size represents the number of grains used for the calculation of the average grain size.

TABLE 6

| | CIE-x | CIE-y | Conversion efficiency (lm/Wopt) |
|---|---|---|---|
| Example 3-1 | 0.309 | 0.311 | 146 |
| Example 3-2 | 0.293 | 0.293 | 157 |
| Example 3-3 | — | — | — |

It can thus be seen that, by using a sintered phosphor-composite of the present embodiment, a sintered phosphor-composite showing a high internal quantum efficiency and a high transmittance, and a light-emitting device having excellent optical properties can be obtained.

While the invention has been described in detail and with reference to specific embodiments thereof, it will be apparent to one skilled in the art that various changes and modifications can be made therein without departing from the spirit and scope thereof.

REFERENCE SIGNS LIST

10 Light-emitting device
1 Blue semiconductor light-emitting element
2 Circuit board
2a Chip-mounting surface
3 Plate-shaped sintered phosphor-composite
4 Frame body

The invention claimed is:

1. A sintered phosphor-composite, comprising:
   a phosphor; and
   a crystalline inorganic binder having a cubic crystal system,
   wherein the sintered phosphor-composite comprises at least a portion in which voids of not more than 1 μm are present in a number of not more than 550 within a cross-sectional area of 0.046 mm$^2$ in cross-sectional observation of the sintered phosphor-composite, and
   wherein a volume fraction of the crystalline inorganic binder to a total volume of the phosphor and the crystalline inorganic binder is not less than 50%.

2. The composite of claim 1, wherein the phosphor is a nitride-comprising phosphor, an oxide-comprising phosphor, an oxynitride-comprising phosphor, or a combination of two or more of any of these.

3. The composite of claim 1, wherein the phosphor is an oxide phosphor having a crystalline phase with a garnet structure represented by A$_3$B$_5$O$_{12}$,
   wherein A is Y, Lu, Gd, and/or La, and B is Al and/or Ga.

4. The composite of claim 1, having a concentration of carbon of not more than 1 wt %.

5. The composite of claim 1, having a concentration of oxygen of not more than 1 wt %.

6. A sintered phosphor-composite, comprising:
   a phosphor; and
   a crystalline inorganic binder having a cubic crystal system,
   wherein the sintered phosphor-composite comprises at least a portion having a void area fraction of not more than 0.3% within a cross-sectional area of 0.046 mm$^2$ in cross-sectional observation of the sintered phosphor-composite, and
   wherein a volume fraction of the crystalline inorganic binder to a total volume of the phosphor and the crystalline inorganic binder is not less than 50%.

7. The composite of claim 6, wherein the phosphor is a nitride-comprising phosphor, an oxide-comprising phosphor, an oxynitride-comprising phosphor, or a combination of two or more of any of these.

8. The composite of claim 6, wherein the phosphor is an oxide phosphor having a crystalline phase with a garnet structure represented by A$_3$B$_5$O$_{12}$,
   wherein A is Y, Lu, Gd, and/or La, and B is Al and/or Ga.

9. The composite of claim 6, having a concentration of carbon of not more than 1 wt %.

10. The composite of claim 6, having a concentration of oxygen of not more than 1 wt %.

11. A sintered phosphor-composite, comprising:
    a nitride phosphor; and
    a fluoride inorganic binder,
    wherein the sintered phosphor-composite comprises at least a portion in which voids of not more than 1 μm are present in a number of not more than 700 within a cross-sectional area of 0.046 mm$^2$ in cross-sectional observation of the sintered phosphor-composite.

12. The composite of claim 11, comprising at least a portion having a void area fraction of not more than 3% within a cross-sectional area of 0.046 mm$^2$ in cross-sectional observation of the composite.

13. The composite of claim 12, wherein the nitride phosphor comprises a phosphor having a crystalline phase of formula (I):

$$Ln_xSi_6N_yM_z \qquad (1)$$

wherein, in formula (1),
Ln represents one or more rare earth elements excluding elements used as activation elements;
M represents one or more elements activation elements; and
x, y, and z each independently represent a value satisfying formulae:

$$2.7 < x < 3.3;$$

$$10 < y < 12; \text{ and}$$

$$0 < z < 1.0.$$

14. The composite of claim 11, having a concentration of carbon of not more than 1 wt %.

15. The composite of claim 11, having a concentration of oxygen of not more than 1 wt %.

16. A light-emitting device, comprising:
    the composite of claim 1; and
    an LED or a semiconductor laser as a light source,
    wherein the sintered phosphor-composite absorbs at least part of light from the light source to emit light having a different wavelength.

17. A light-emitting device, comprising:
the composite of claim 6; and
an LED or a semiconductor laser as a light source,
wherein the sintered phosphor-composite absorbs at least part of light from the light source to emit light having a different wavelength.

18. A light-emitting device, comprising:
the composite of claim 11; and
an LED or a semiconductor laser as a light source,
wherein the composite absorbs at least part of light from the light source to emit light having a different wavelength.

19. A lighting device comprising the device of claim 16.

20. A vehicle indicator lamp comprising the device of claim 16.

* * * * *